(12) United States Patent
Lee

(10) Patent No.: US 8,362,510 B2
(45) Date of Patent: Jan. 29, 2013

(54) LIGHT EMITTING DEVICE AND METHOD OF MANUFACTURING THE SAME

(75) Inventor: Jong-Lam Lee, Seoul (KR)

(73) Assignees: Seoul Opto Device Co., Ltd., Ansan-si (KR); POSTECH Academy-Industry Foundation, Pohang-si (KR)

( * ) Notice: Subject to any disclaimer, the term of this patent is extended or adjusted under 35 U.S.C. 154(b) by 119 days.

(21) Appl. No.: 13/076,075

(22) Filed: Mar. 30, 2011

(65) Prior Publication Data

US 2011/0175130 A1      Jul. 21, 2011

Related U.S. Application Data

(63) Continuation of application No. 12/808,333, filed as application No. PCT/KR2008/006266 on Oct. 23, 2008.

(30) Foreign Application Priority Data

Dec. 18, 2007 (KR) .................. 10-2007-0133138
Apr. 15, 2008 (KR) .................. 10-2008-0034655

(51) Int. Cl.
*H01L 33/00* (2010.01)
(52) U.S. Cl. .................. 257/98; 257/E33.074
(58) Field of Classification Search .............. 257/98, 257/E33.074
See application file for complete search history.

(56) References Cited

U.S. PATENT DOCUMENTS

| 7,250,638 B2 | 7/2007 | Lee et al. |
| 2006/0148115 A1 | 7/2006 | Yoo |
| 2012/0018700 A1 | 1/2012 | Jang et al. |

FOREIGN PATENT DOCUMENTS

| CN | 101084583 | 12/2007 |
| KR | 10-2004-0104232 | 12/2004 |
| WO | 2006043796 | 4/2006 |

OTHER PUBLICATIONS

Chinese Office Action dated Jun. 2, 2011 for Chinese Application No. 200880121299.9, which corresponds to U.S. Appl. No. 12/808,333.
Notice of Allowance issued for related U.S. Appl. No. 12/808,333 dated Aug. 1, 2012.
International Search Report of PCT/KR2008/006266 issued on Apr. 30, 2009.

*Primary Examiner* — Kimberly Rizkallah
*Assistant Examiner* — Marvin Payen
(74) *Attorney, Agent, or Firm* — H.C. Park & Associates, PLC

(57) ABSTRACT

Provided are a vertical-type light emitting device and a method of manufacturing the same. The light emitting device includes a p-type semiconductor layer, an active layer, and an n-type semi-conductor layer that are stacked, a cover layer disposed on a p-type electrode layer to surround the p-type electrode layer, a conductive support layer disposed on the cover layer, and an n-type electrode layer disposed on the n-type semiconductor layer.

17 Claims, 21 Drawing Sheets

[Fig. 1]
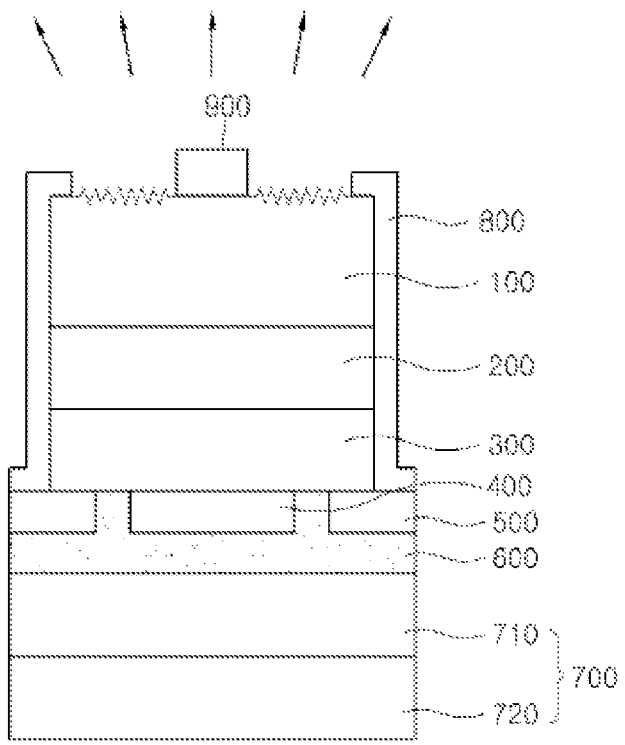
[Fig. 2]
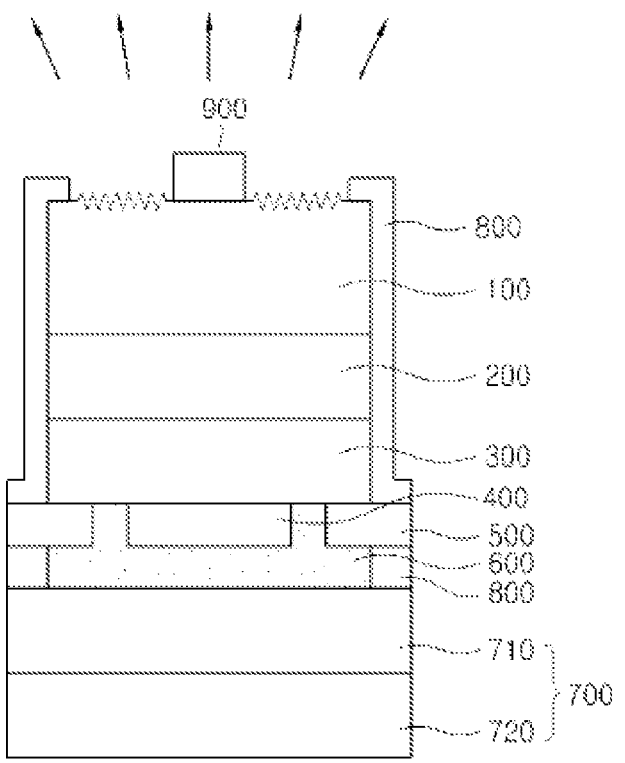

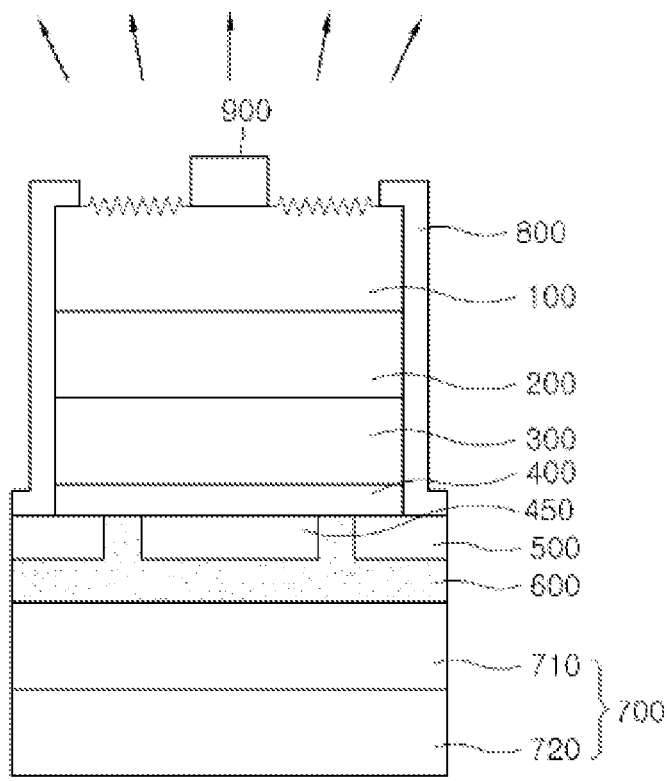
[Fig. 3]
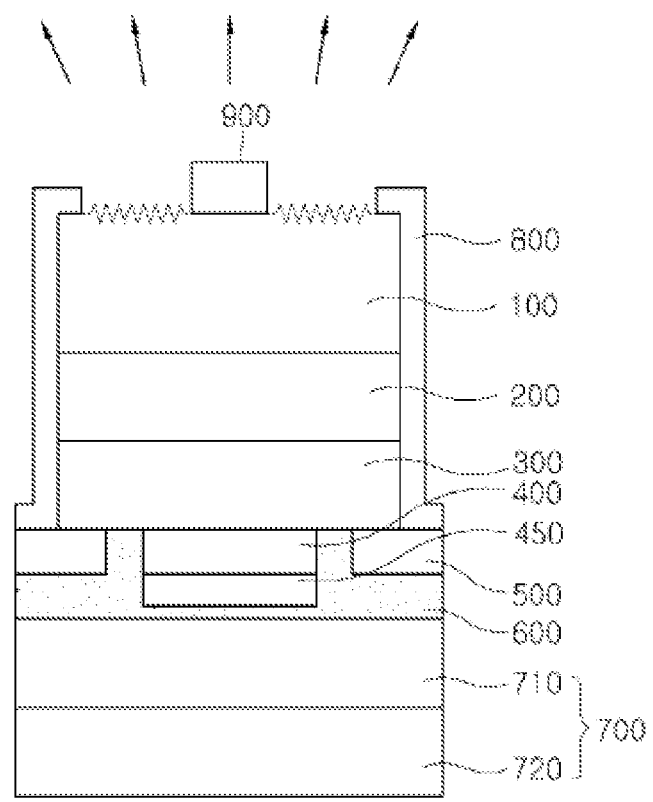
[Fig. 4]

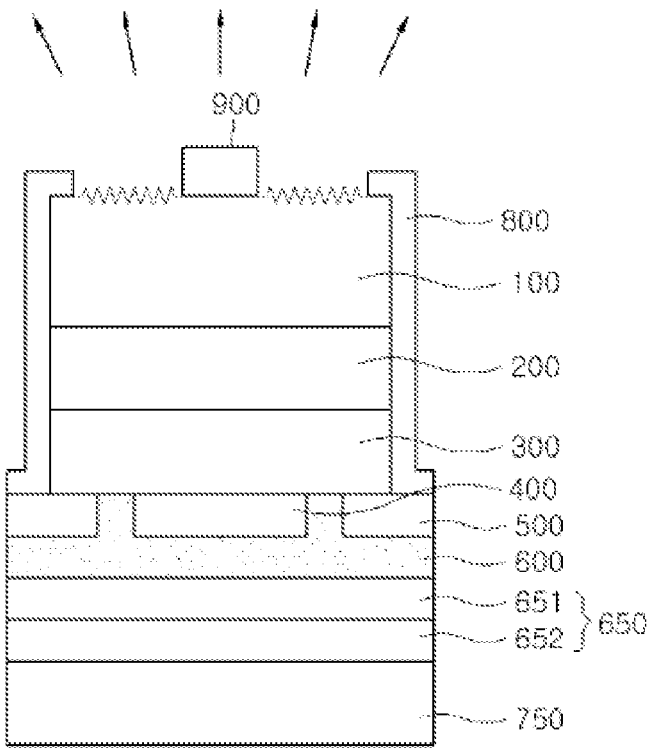
[Fig. 5]
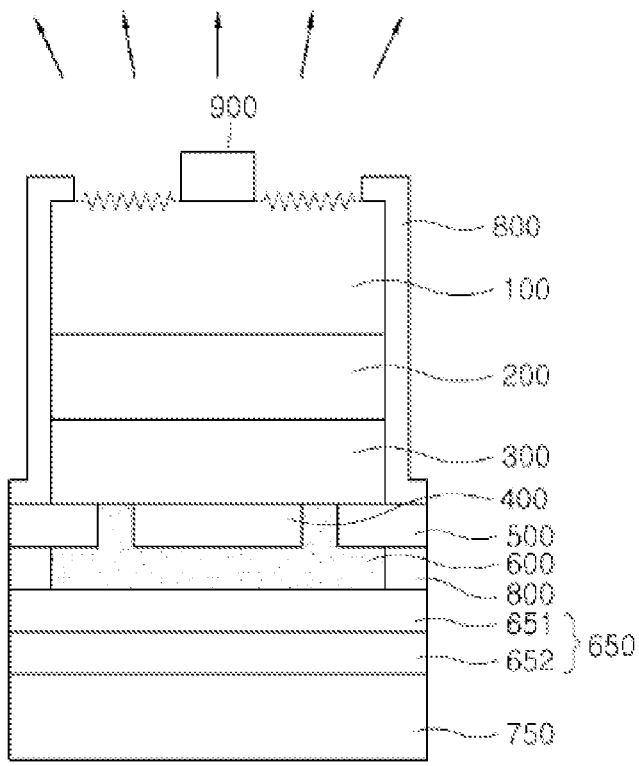
[Fig. 6]

[Fig. 7]
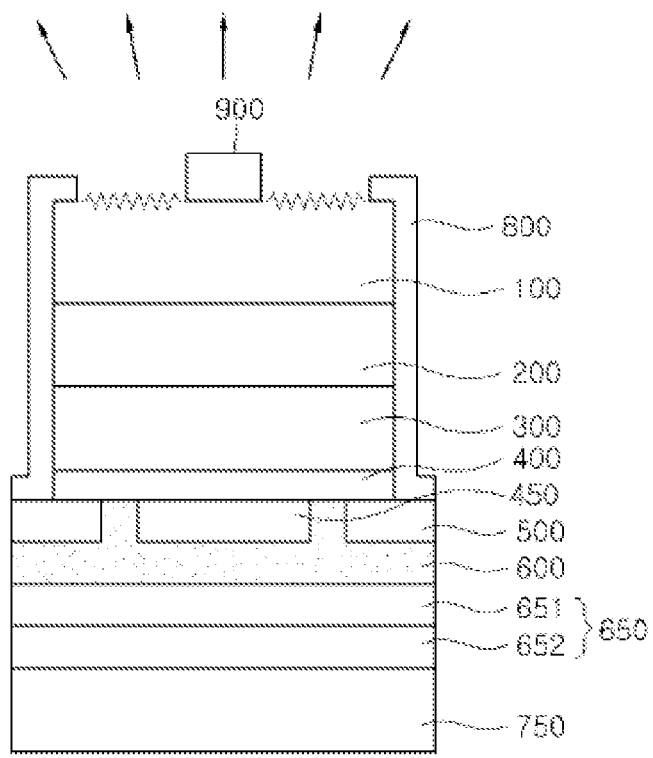
[Fig. 8]
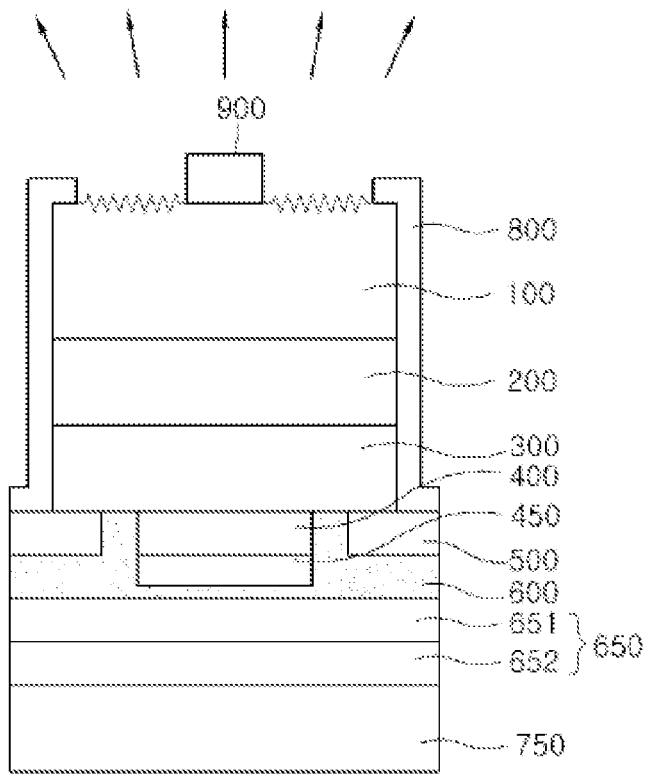

[Fig. 9]
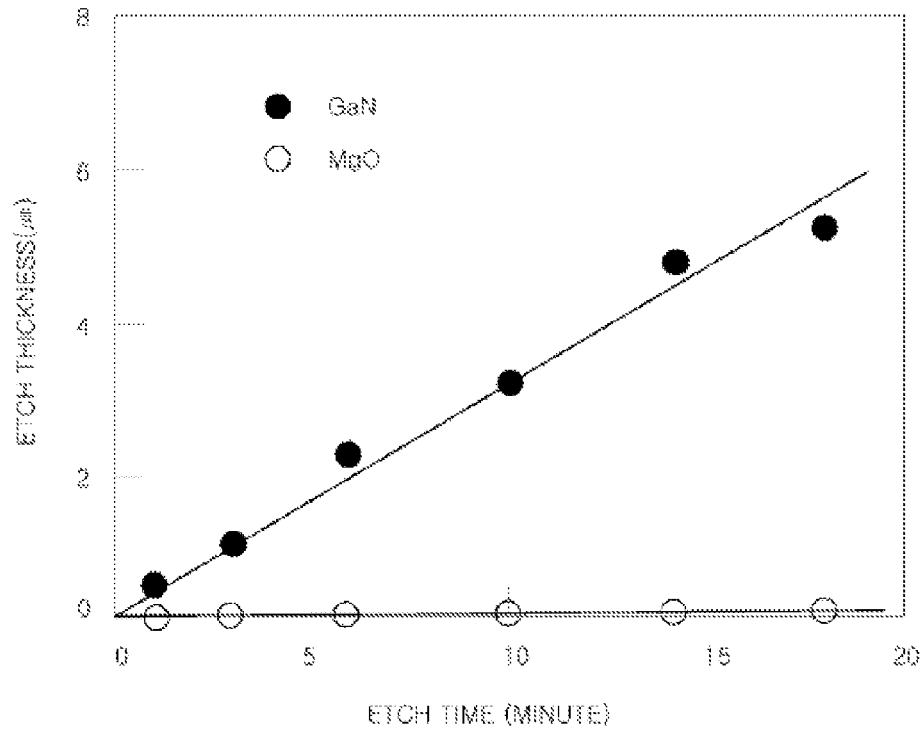
[Fig. 10]
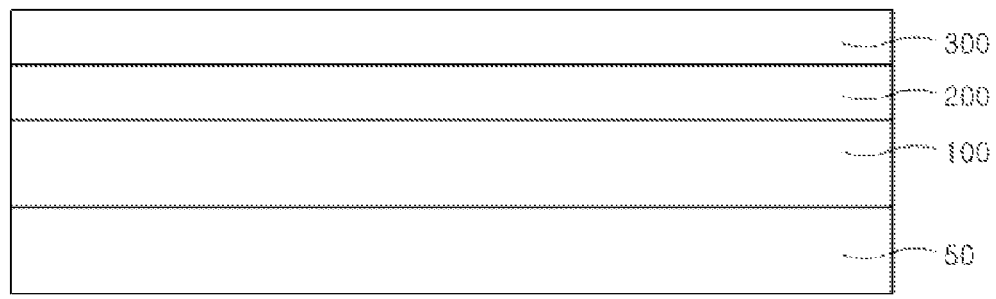
[Fig. 11]
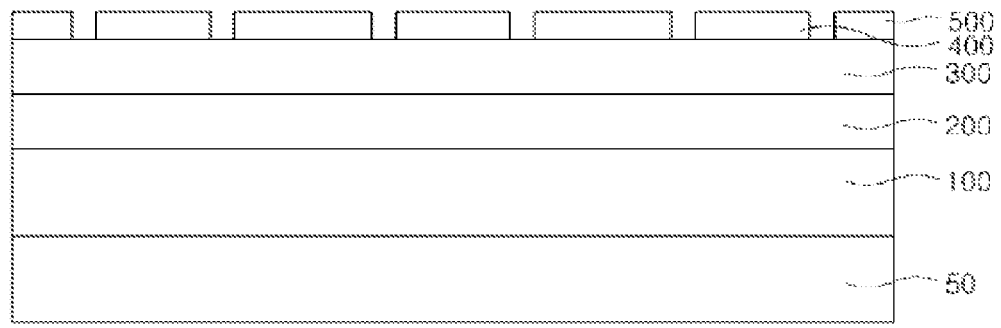

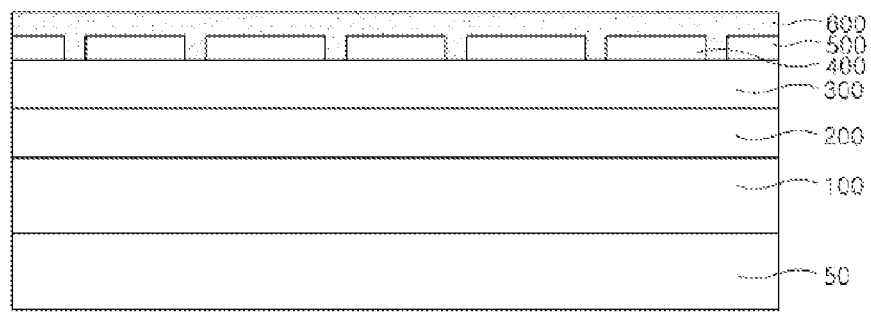
[Fig. 12]
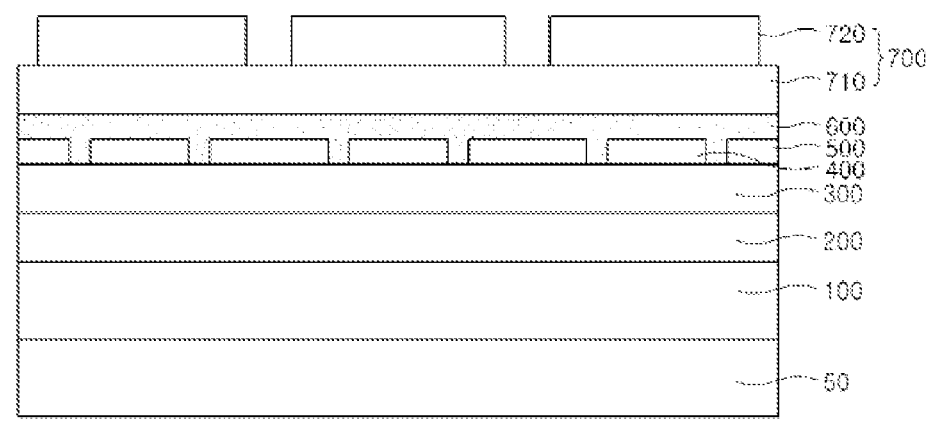
[Fig. 13]
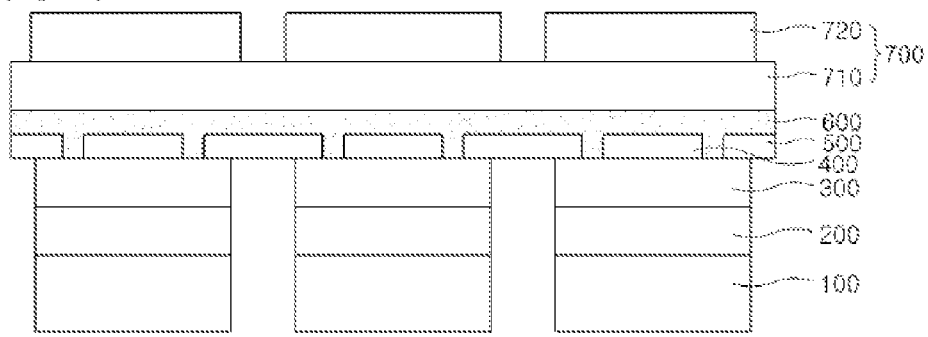
[Fig. 14]
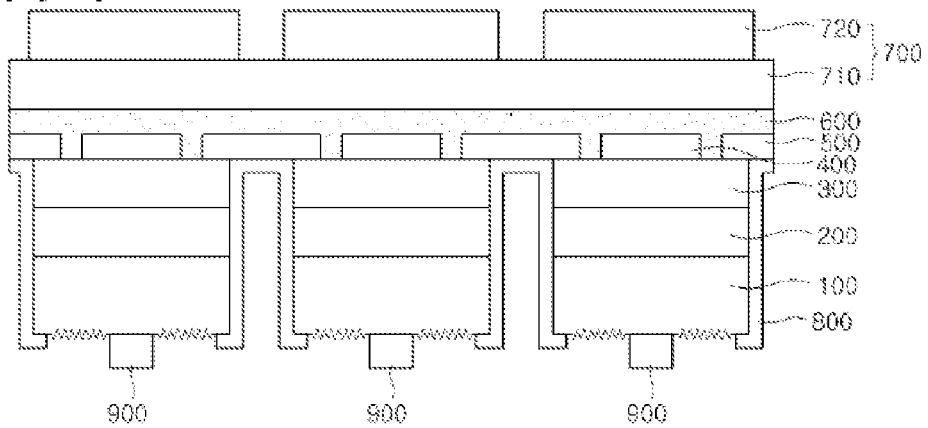
[Fig. 15]

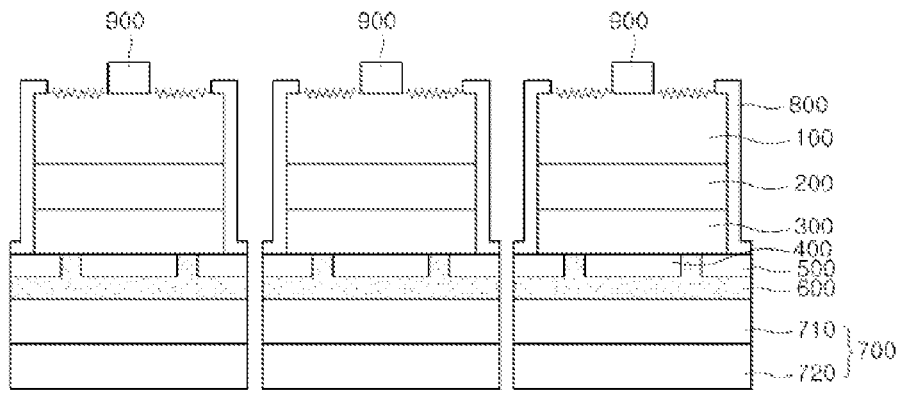
[Fig. 16]
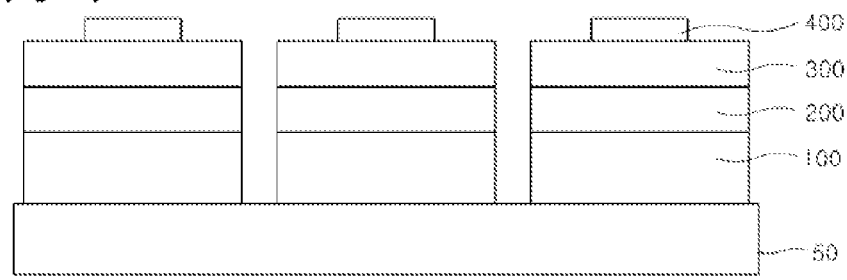
[Fig. 17]
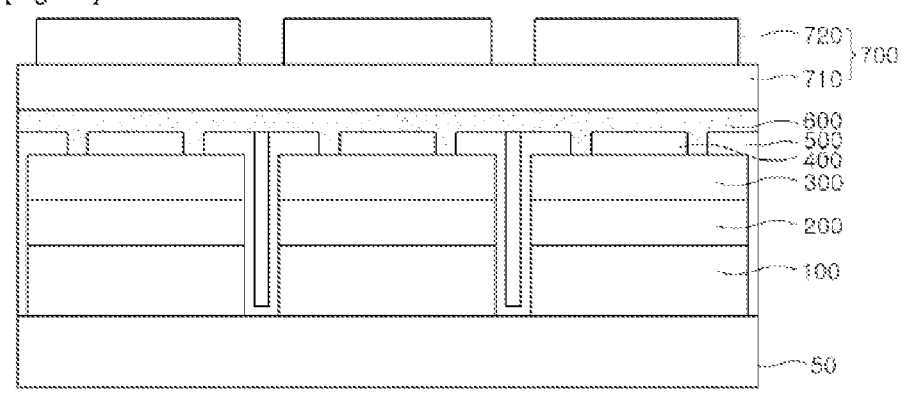
[Fig. 18]
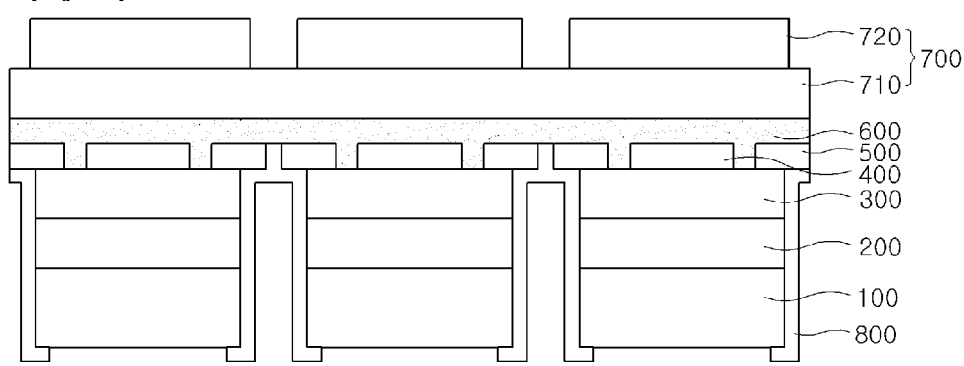
[Fig. 19]

[Fig. 20]
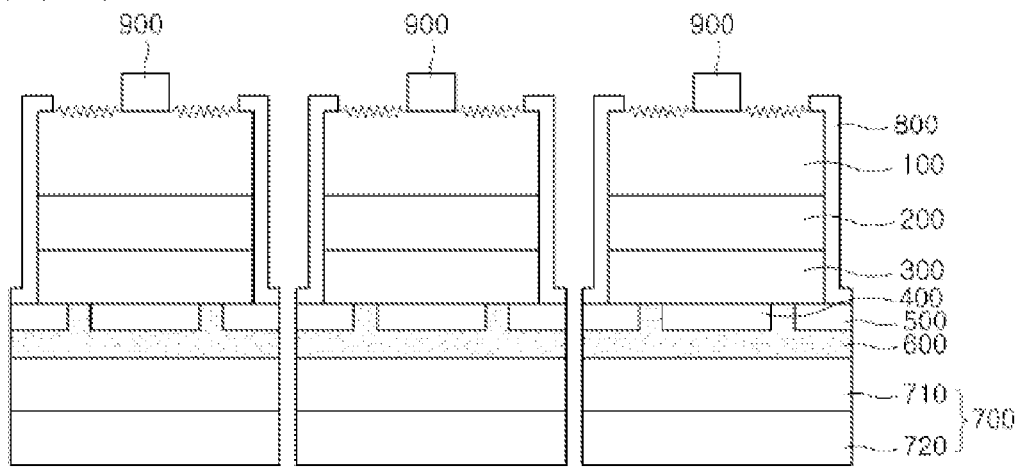
[Fig. 21]
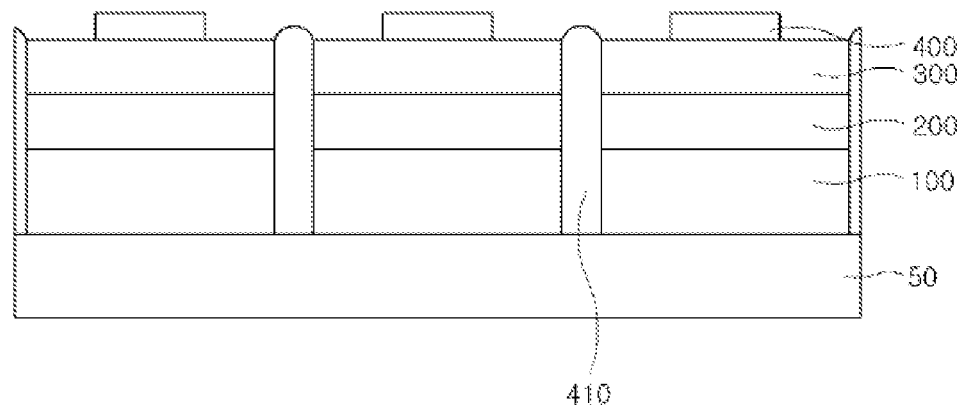
[Fig. 22]
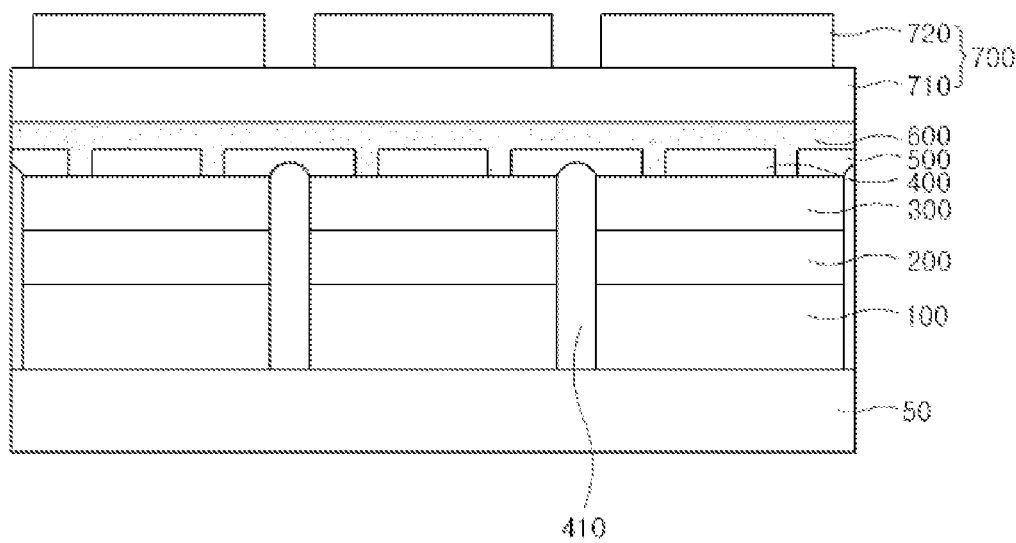

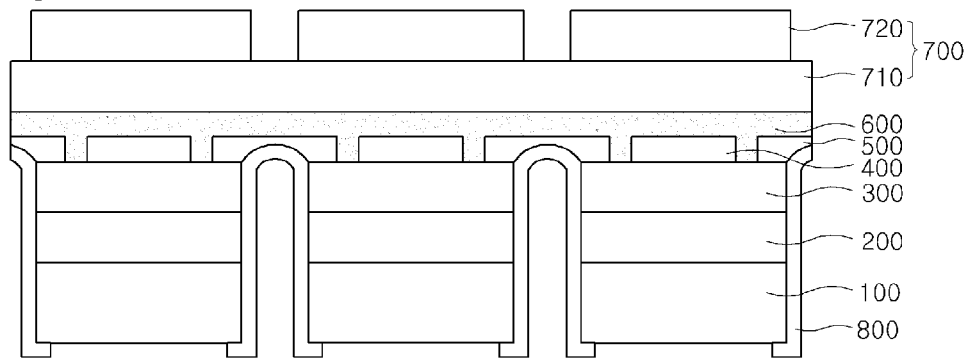
[Fig. 23]
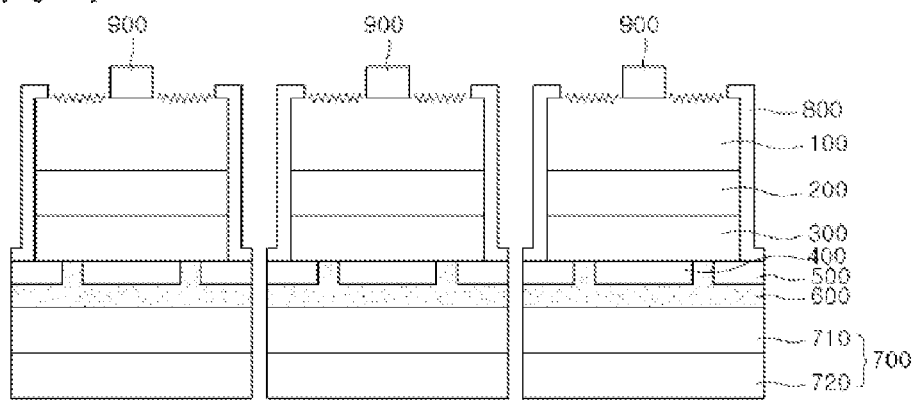
[Fig. 24]
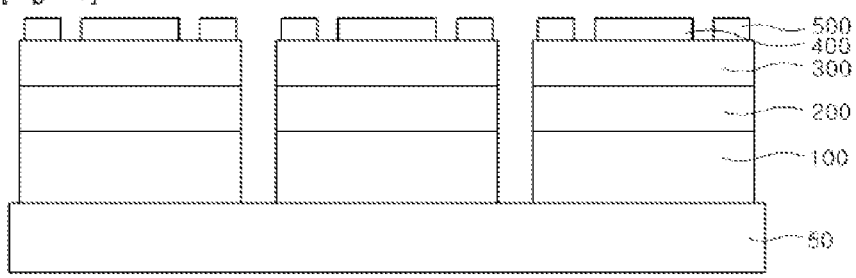
[Fig. 25]
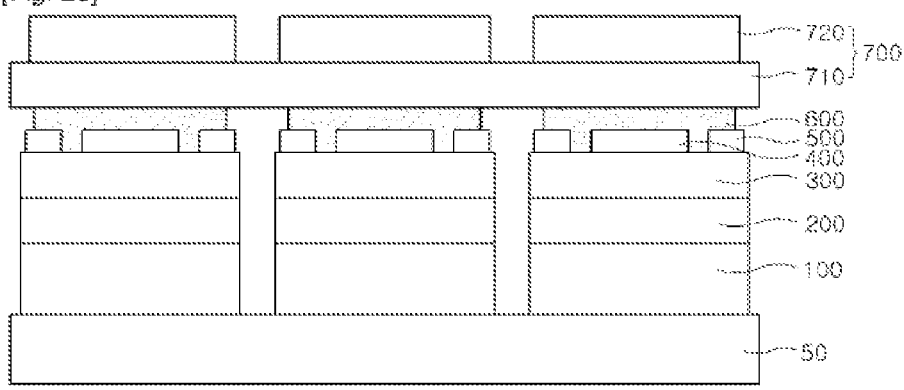
[Fig. 26]

[Fig. 27]
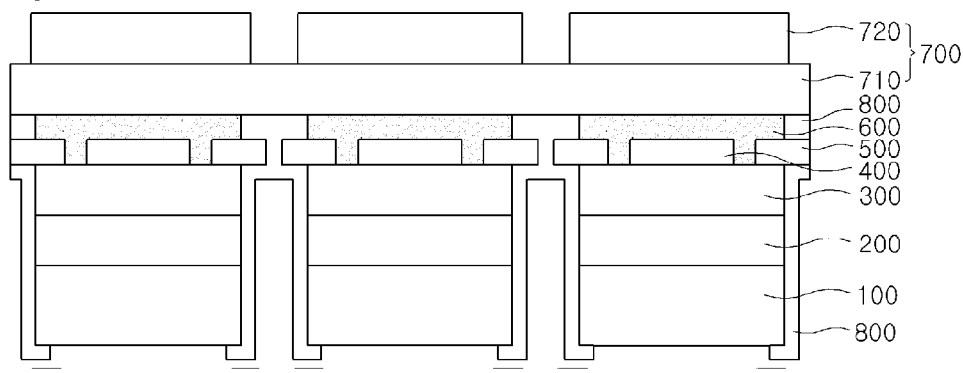
[Fig. 28]
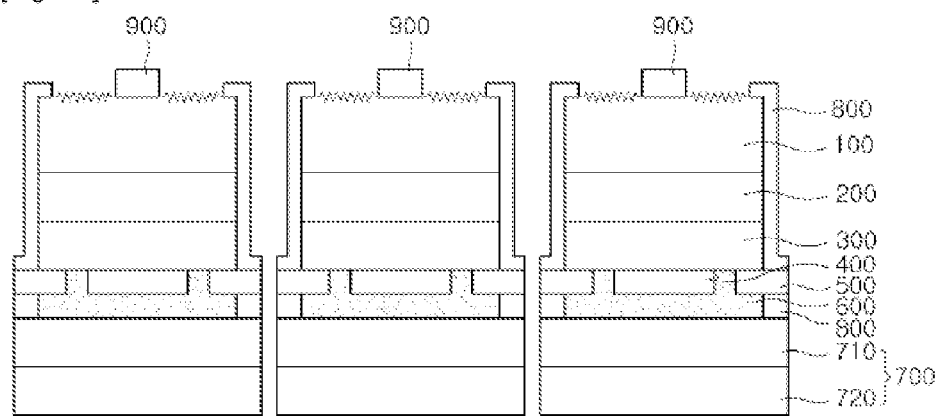
[Fig. 29]
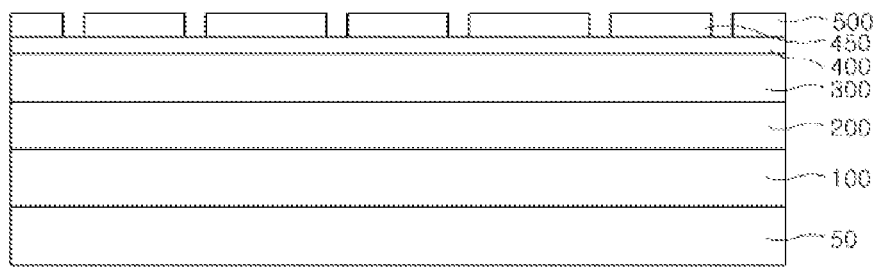
[Fig. 30]
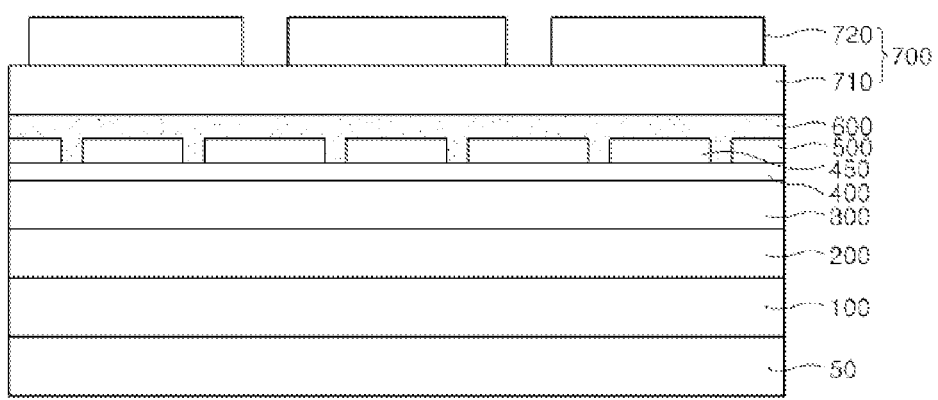

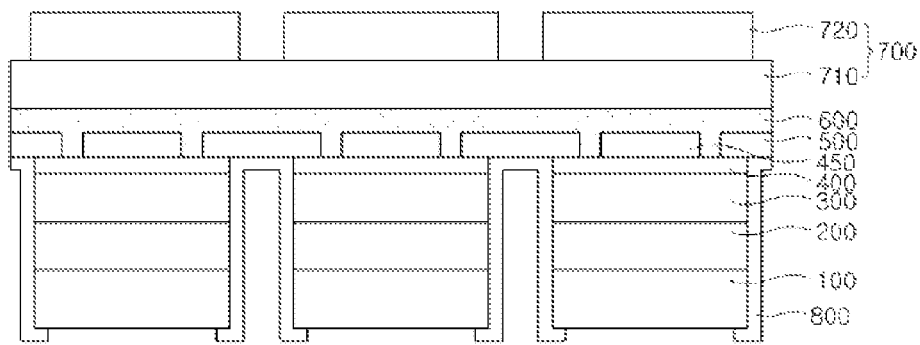
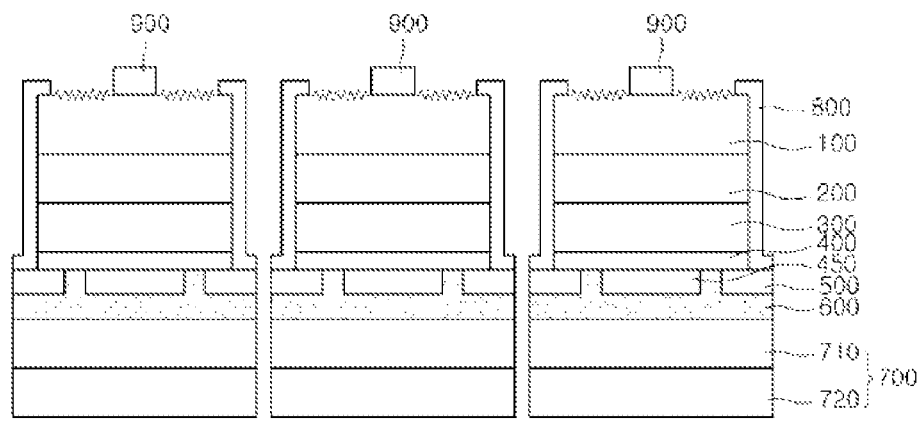
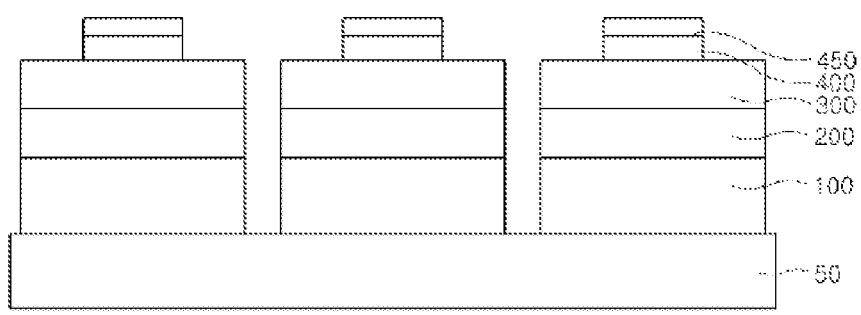
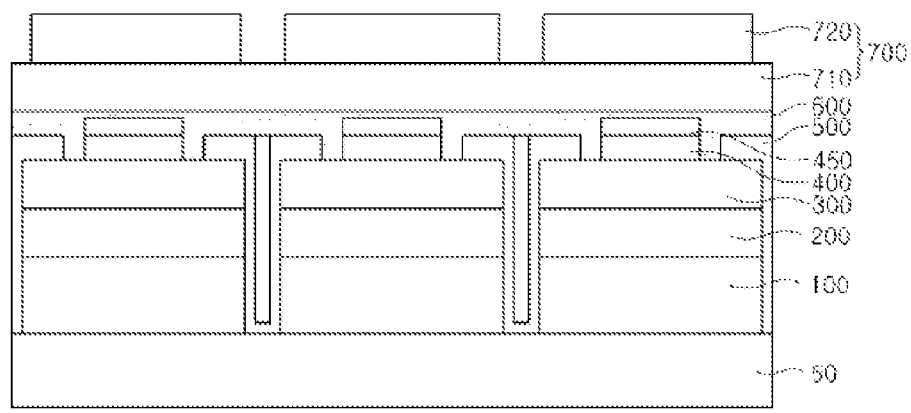

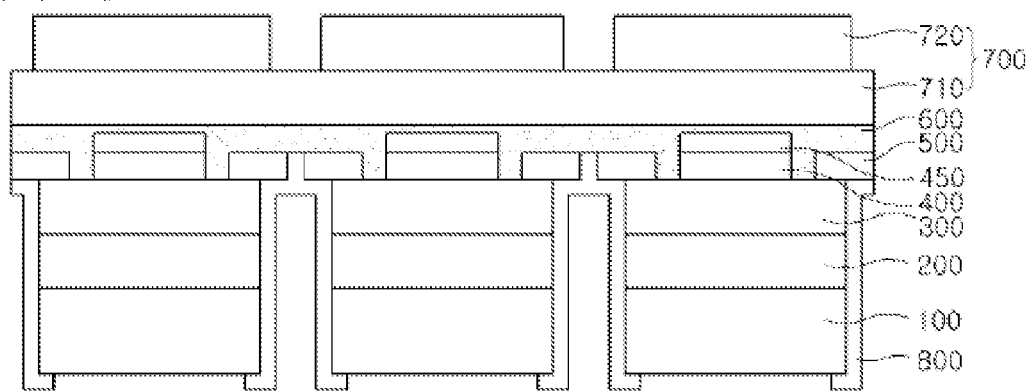
[Fig. 35]
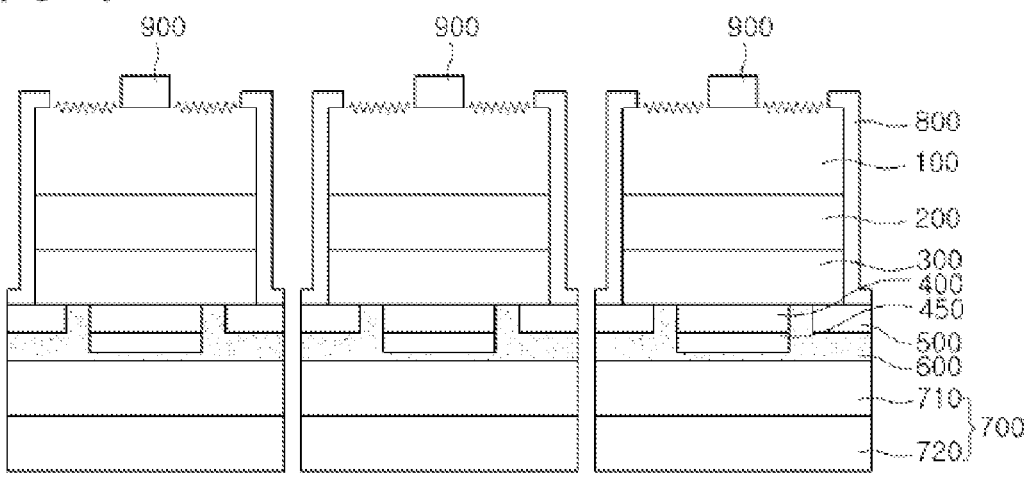
[Fig. 36]
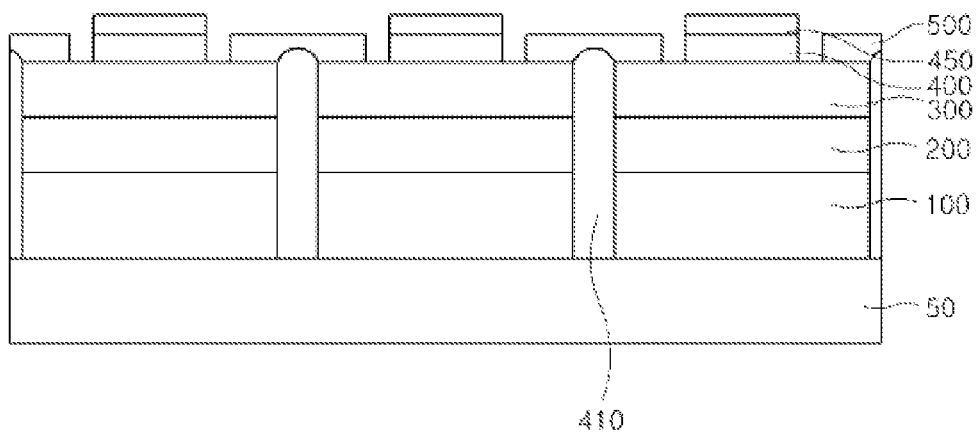
[Fig. 37]

[Fig. 38]
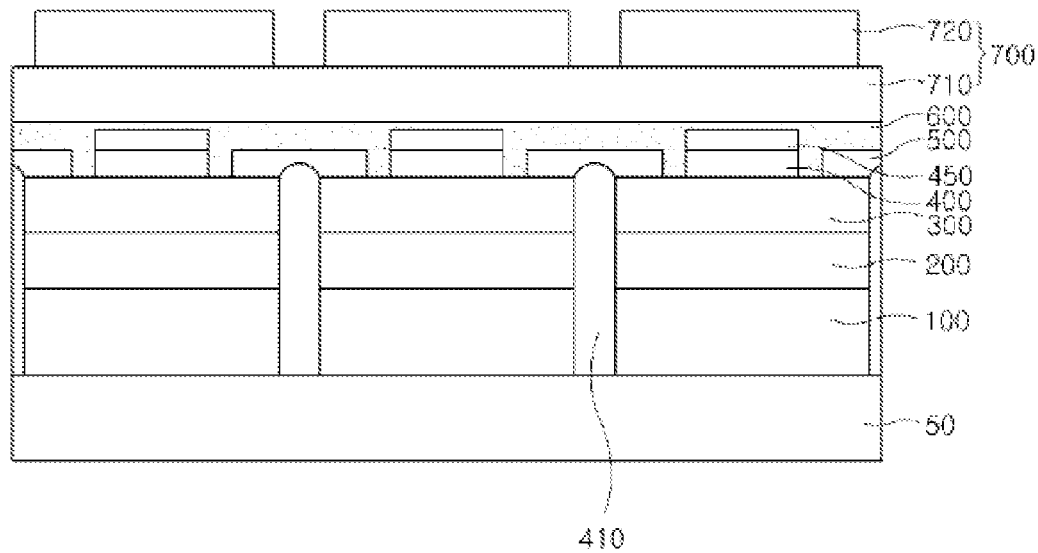
[Fig. 39]
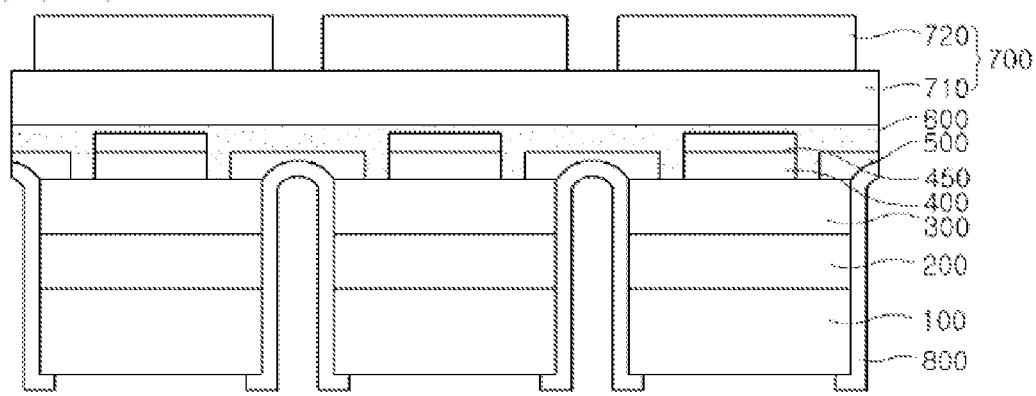
[Fig. 40]
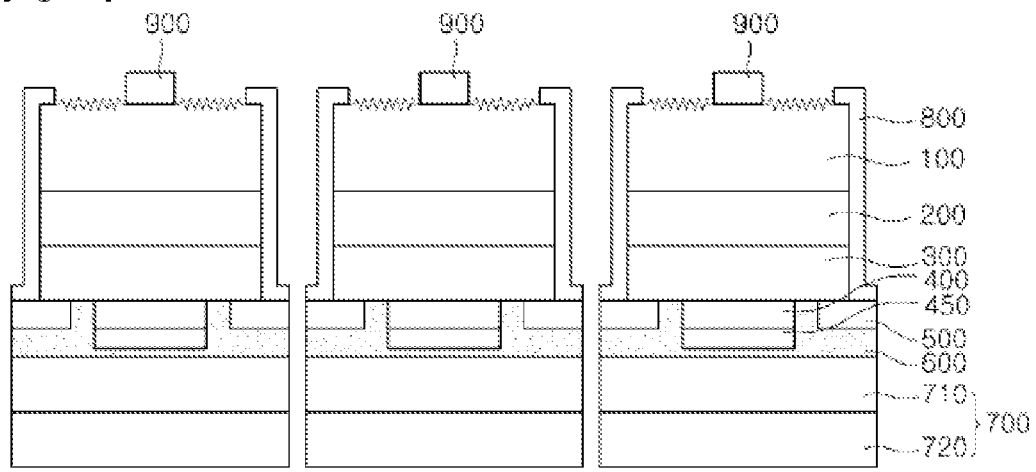

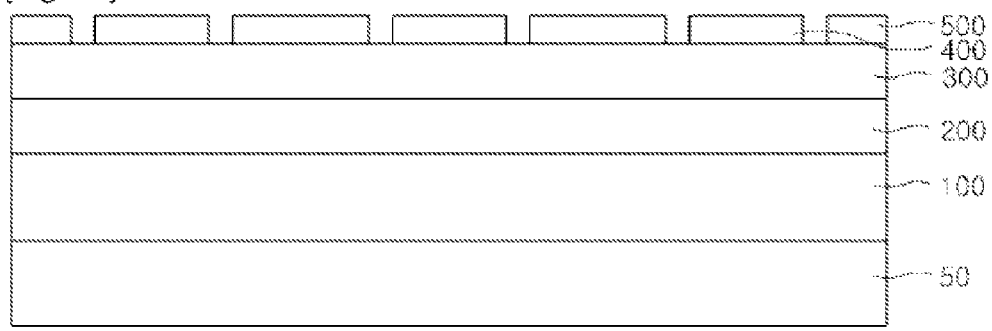
[Fig. 41]
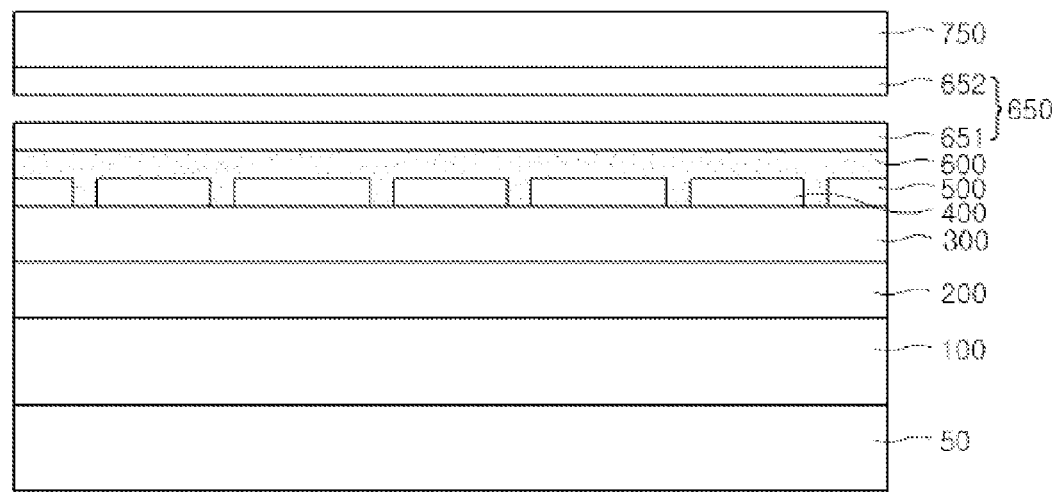
[Fig. 42]
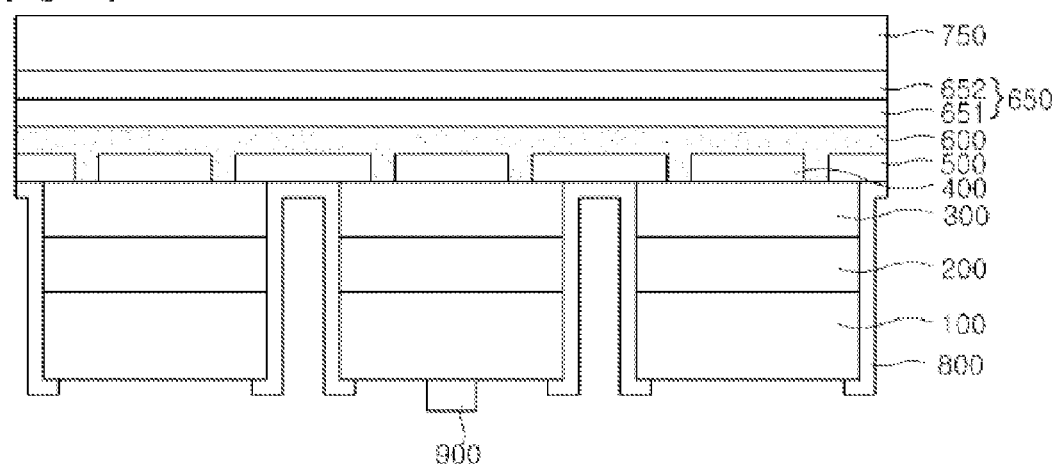
[Fig. 43]

[Fig. 44]
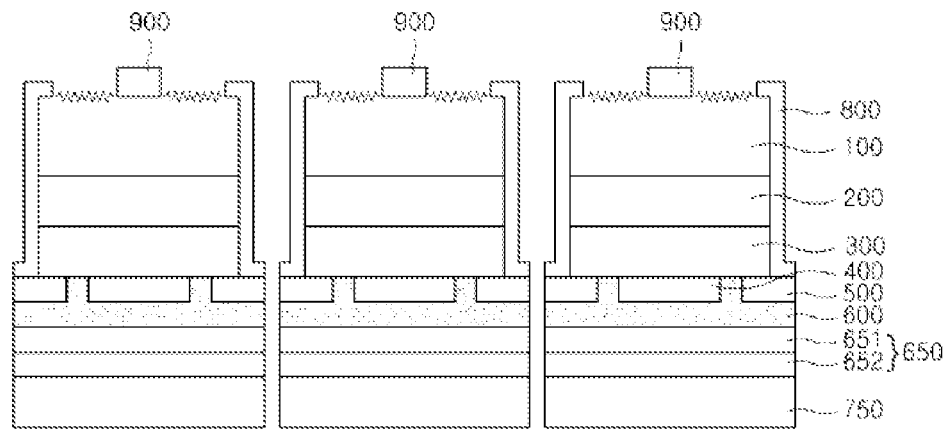
[Fig. 45]
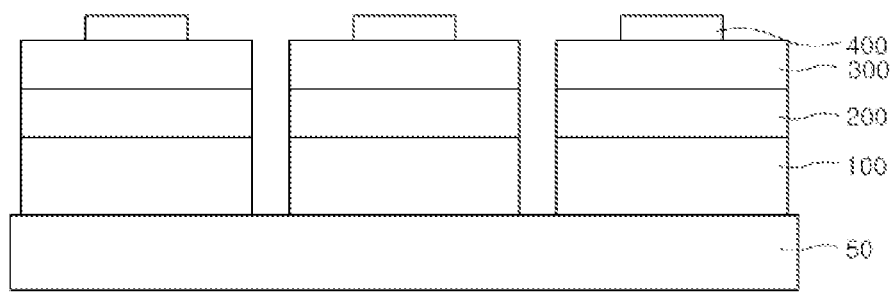
[Fig. 46]
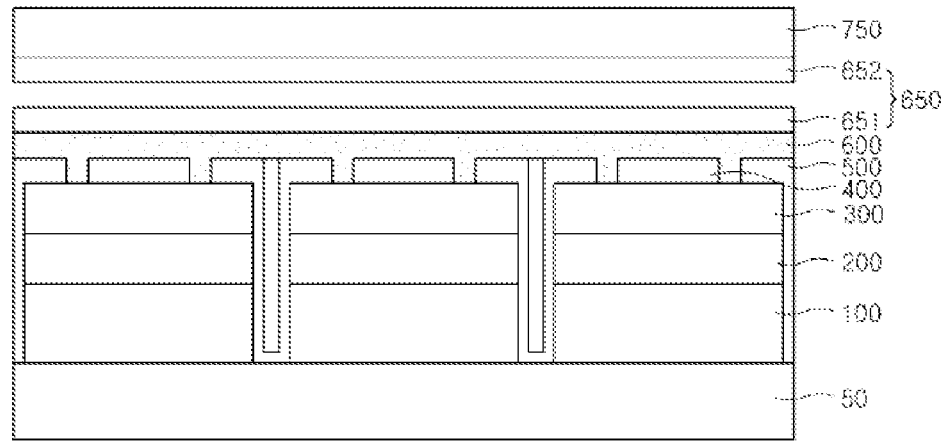
[Fig. 47]
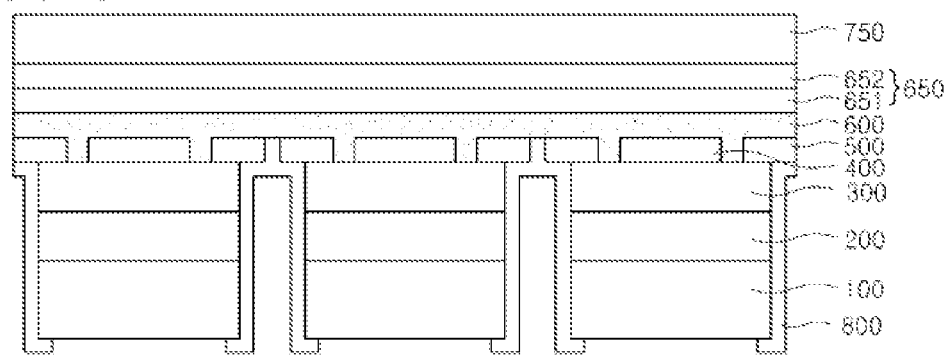

[Fig. 48]
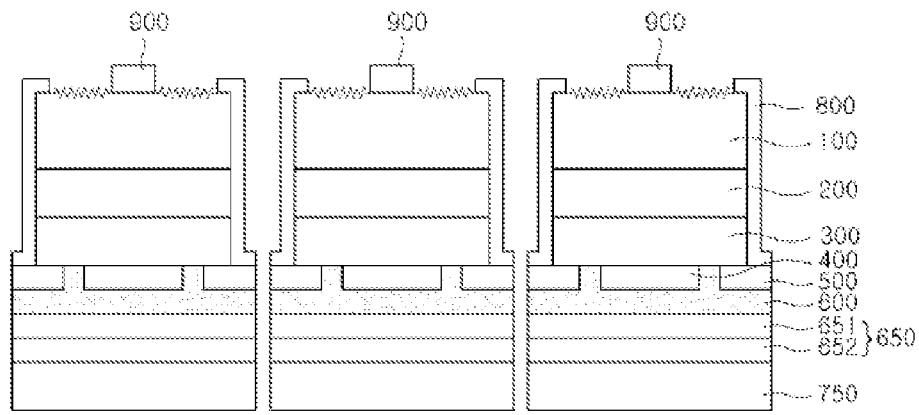
[Fig. 49]
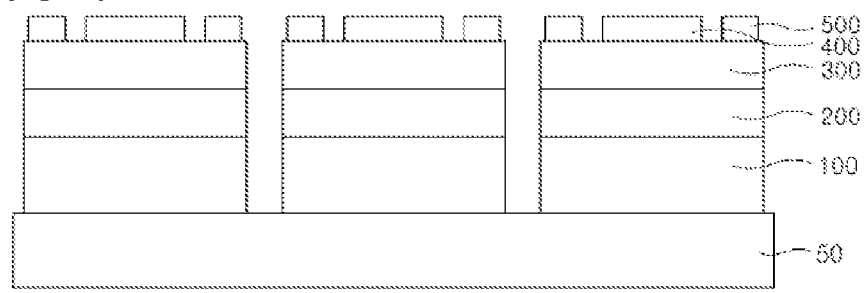
[Fig. 50]
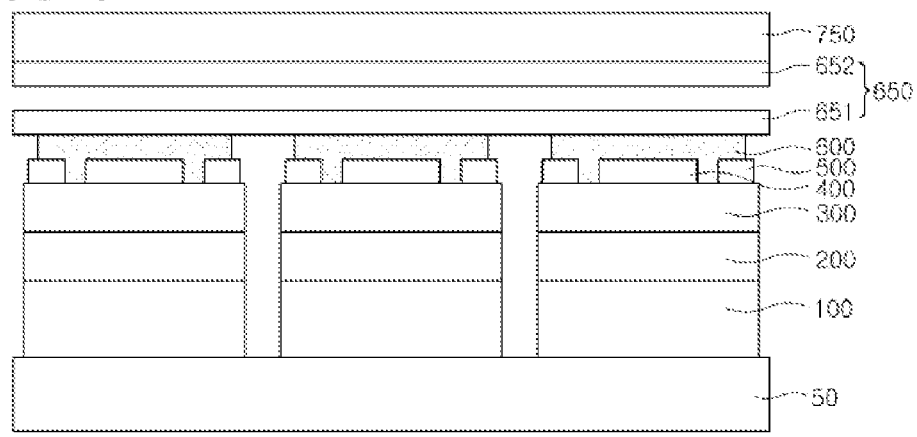
[Fig. 51]
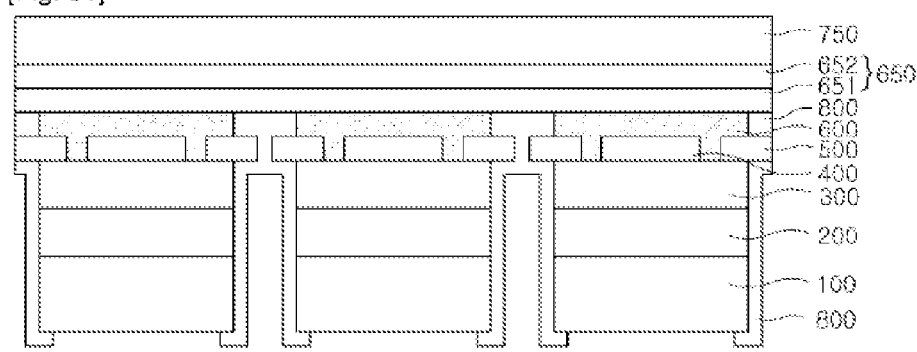

[Fig. 52]
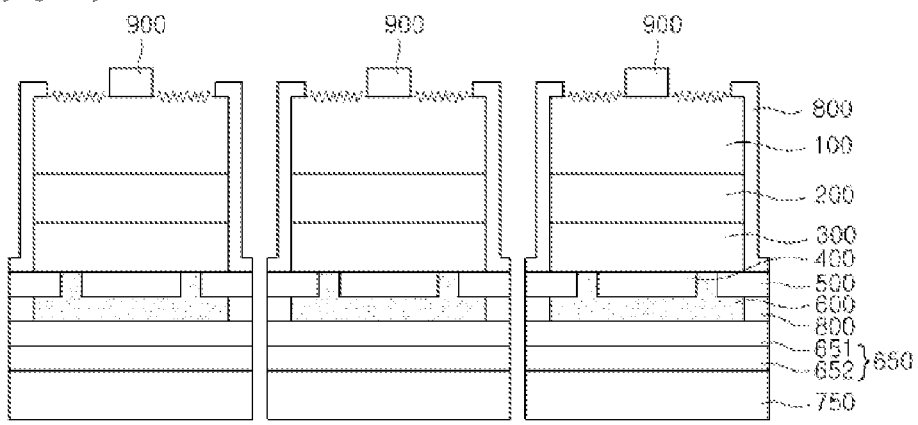
[Fig. 53]
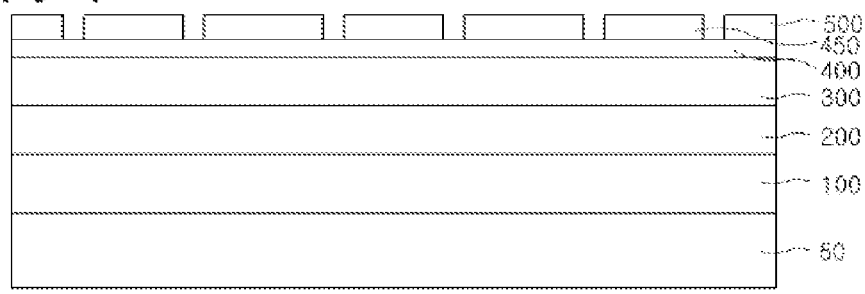
[Fig. 54]
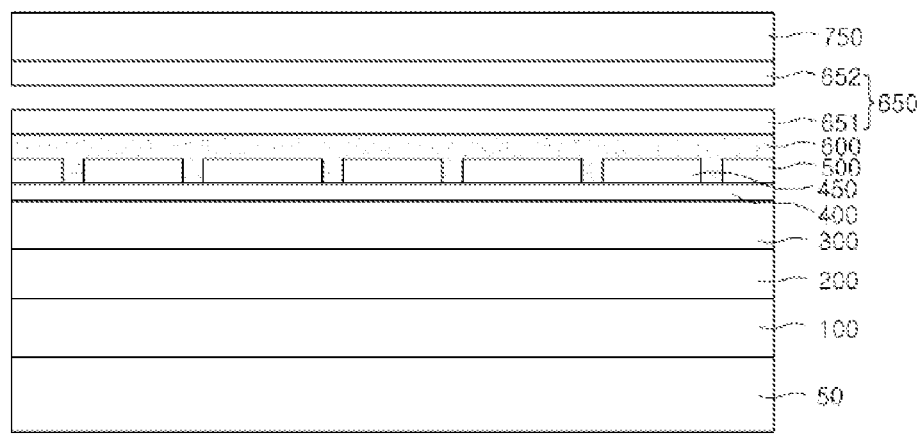
[Fig. 55]
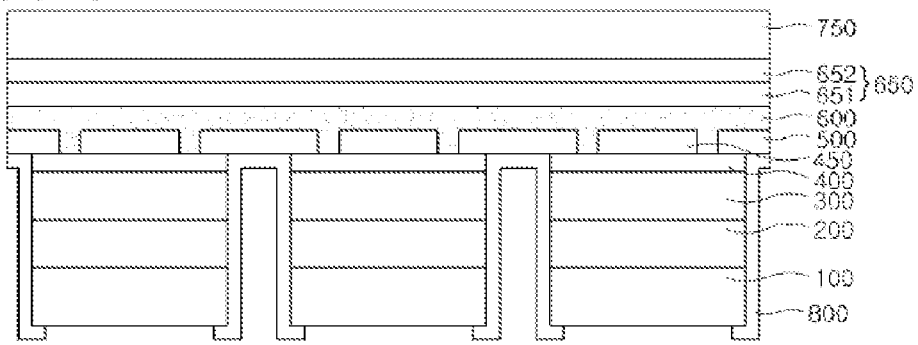

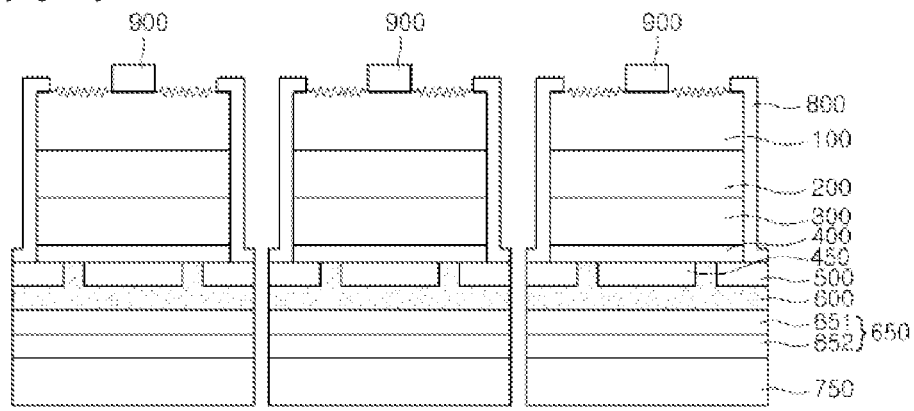
[Fig. 56]
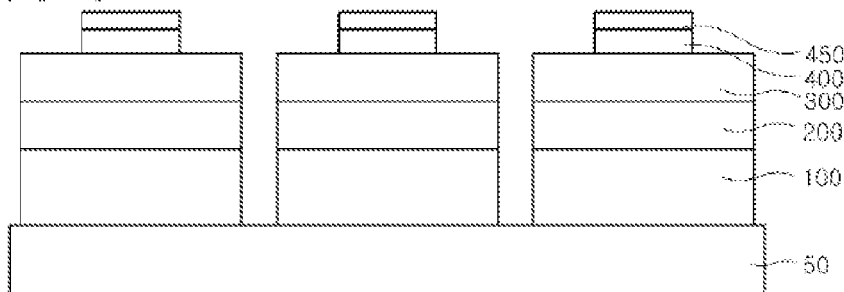
[Fig. 57]
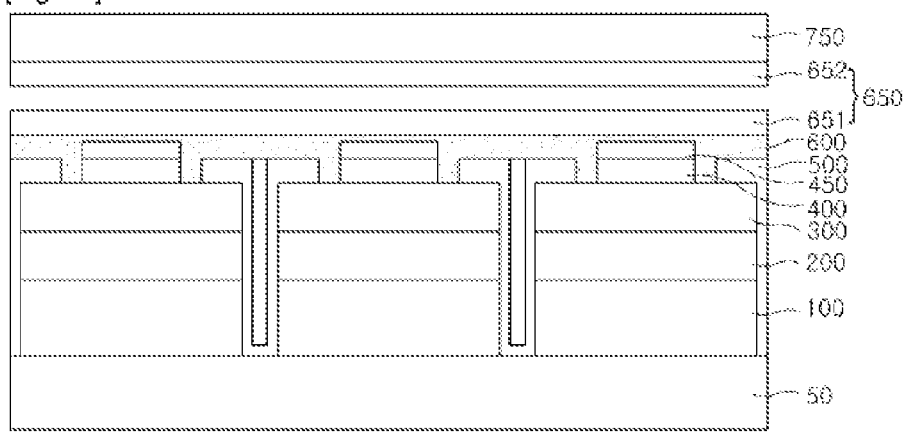
[Fig. 58]
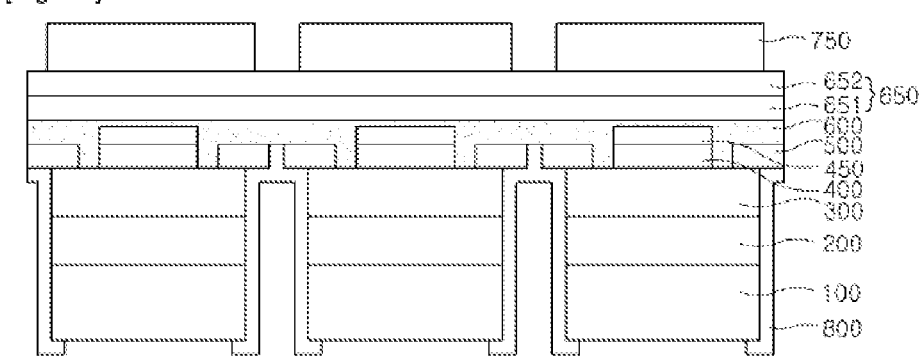
[Fig. 59]

[Fig. 60]
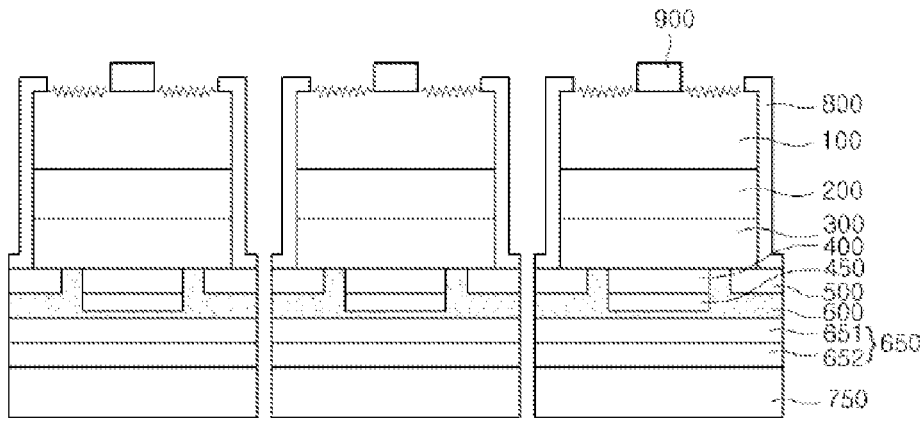
[Fig. 61]
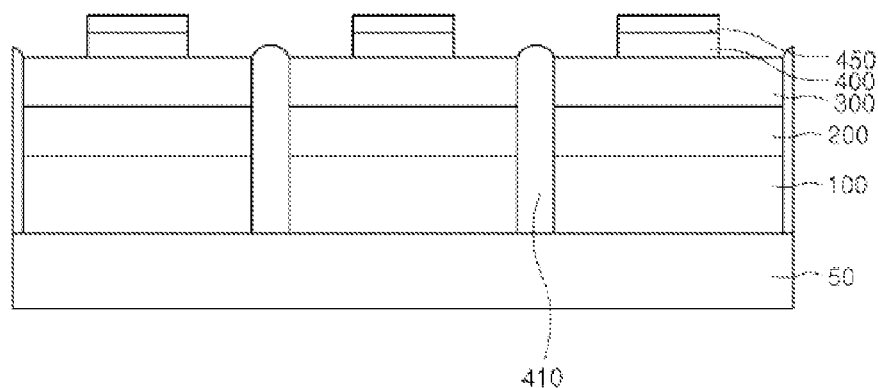
[Fig. 62]
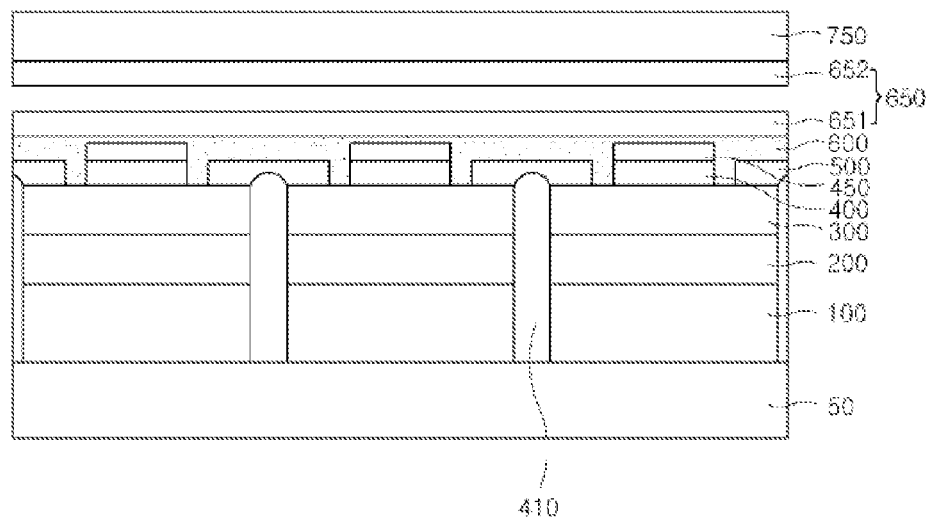

[Fig. 63]
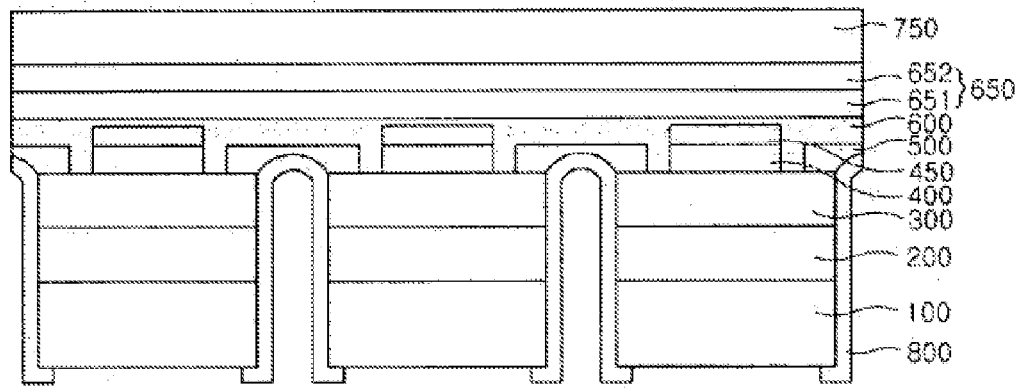
[Fig. 64]
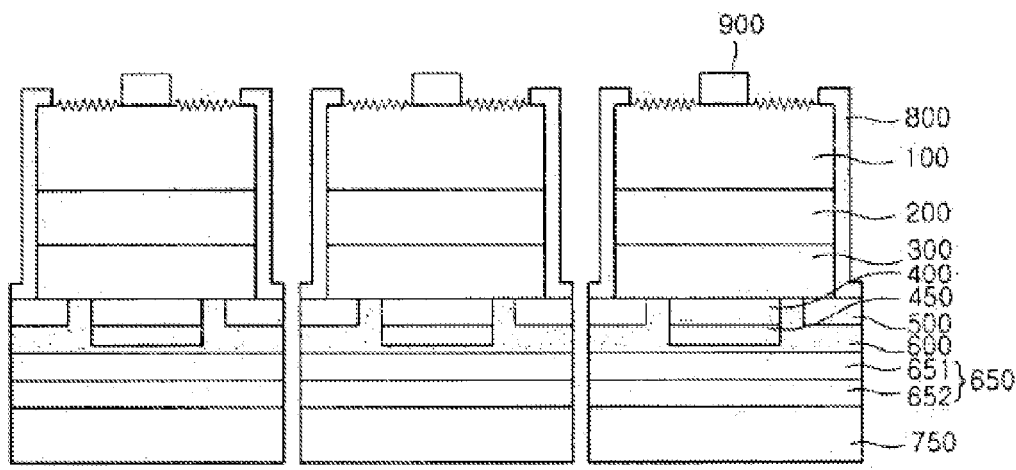
[Fig. 65]
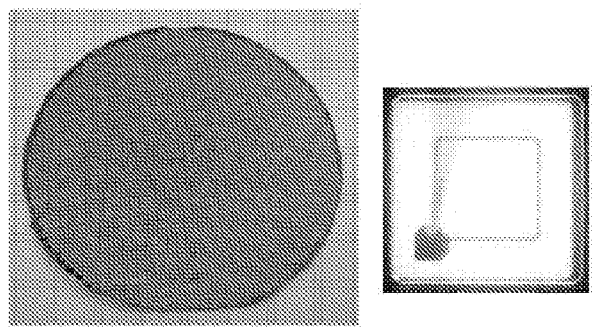

[Fig. 66]
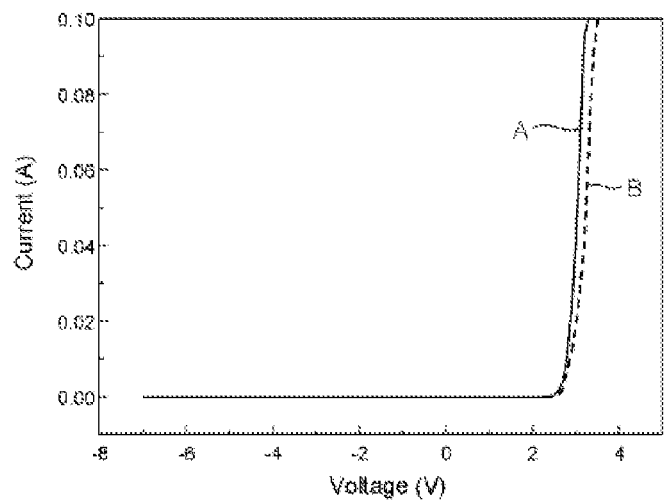
[Fig. 67]
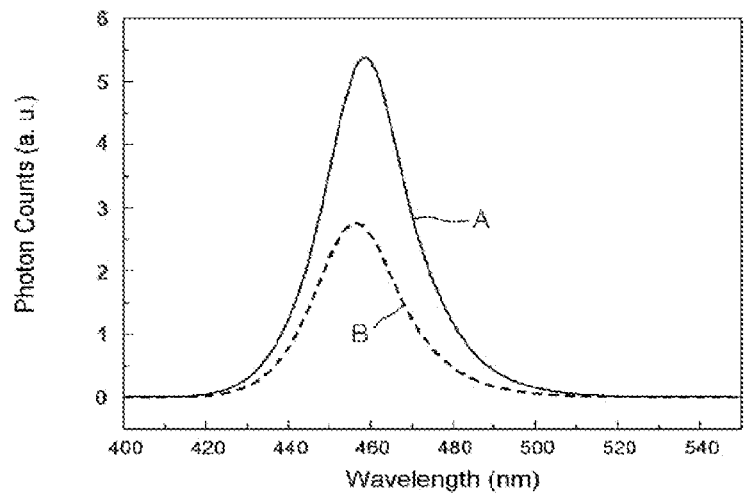
[Fig. 68]
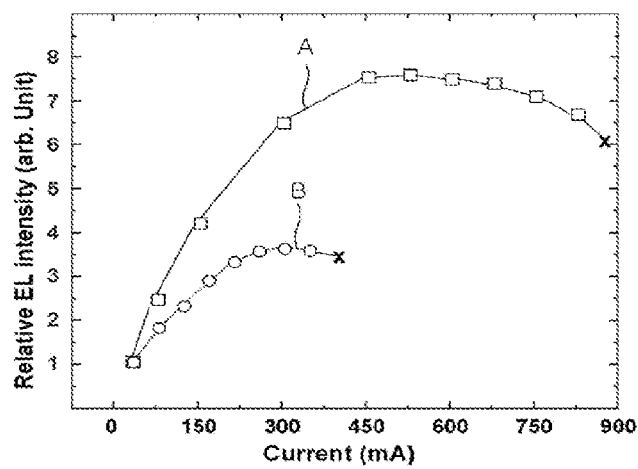

LIGHT EMITTING DEVICE AND METHOD OF MANUFACTURING THE SAME

CROSS-REFERENCE TO RELATED APPLICATIONS

This application is a continuation of U.S. patent application Ser. No. 12/808,333, filed on Jun. 15, 2010, which is the National Stage of International Application No. PCT/KR2008/006266, filed Oct. 23, 2008, and claims priority from and the benefit of Korean Patent Application No. 10-2007-0133138, filed on Dec. 18, 2007, and Korean Patent Application No. 10-2008-0034655, filed on Apr. 15, 2008, which are all hereby incorporated by reference for all purposes as if fully set forth herein.

BACKGROUND OF THE INVENTION

1. Field of the Invention

The present invention relates to a light emitting device and a method of manufacturing the same, and more particularly, to a gallium nitride (hereinafter, referred to as "GaN")-based light emitting device (LED) having a vertical-type structure and a method of manufacturing the same.

2. Discussion of the Background

Recently, as light emitting devices having GaN semiconductors are widely expected to replace typical light sources including incandescent lamps, fluorescent lamps, and mercury arc lamps, researches are being actively conducted into high-power GaN-based light emitting devices.

To manufacture such a GaN-based light emitting device, generally, an n-type GaN layer, an undoped InGaN layer, and a p-type GaN layer are sequentially stacked over a nonconductive sapphire substrate, and electrodes are formed over the n-type GaN layer and the p-type GaN layer, respectively. Since the sapphire substrate is nonconductive, the light emitting device typically has a horizontal-type structure. That is, the electrodes respectively formed over the n-type GaN layer and the p-type GaN layer are horizontally disposed. Thus, current spreading-resistance is great in a high-power operation, decreasing optical power. Also, since heat produced in a device operation is not effectively released through the sapphire substrate, there is a limitation that thermal stability of the device is degraded, thereby making a problem in the high-power operation.

To address these limitations and realize high-power GaN-based light emitting devices, flip-chip-type light emitting devices using a flip-chip package have been proposed. In such a flip-chip-type light emitting device, an electrode of a vertical-type light emitting device is connected to a heat sink through a solder. Since, in the flip-chip-type light emitting device, light emits from an active layer to the outside through a sapphire substrate, a thick p-type ohmic electrode is applicable instead of a transparent electrode, thus reducing the current spreading-resistance. However, the flip-chip-type package used for the flip-chip-type light emitting device causes a manufacturing process to be complicated. Moreover, optical efficiency characteristics of the flip-chip-type light emitting device are degraded because a large amount of photons are absorbed into the sapphire substrate while the light emits from the active layer to the outside through the sapphire substrate.

SUMMARY OF THE INVENTION

The present invention provides a vertical-type light emitting device and a method of manufacturing the same, which can effectively release heat produced when the device operates and improve optical efficiency characteristics.

The present invention also provides a light emitting device and a method of manufacturing the same, which can improve heat release and optical efficiency characteristics by stacking a p-type semiconductor layer, an active layer, and an n-type semiconductor layer over a conductive support layer, and allowing light generated in the active layer to emit through the n-type semiconductor layer.

The present invention also provides a light emitting device and a method of manufacturing the same in which an n-type semiconductor layer, an active layer, and a p-type semiconductor layer are formed over a sapphire substrate, then a conductive substrate is formed over the p-type semiconductor layer, and thereafter the sapphire substrate is removed.

In accordance with an exemplary embodiment of the present invention, a light emitting device includes: a p-type semiconductor layer, an active layer, and an n-type semiconductor layer that are stacked; a p-type electrode layer and an etch stop layer that are disposed on the p-type semiconductor layer; a cover layer disposed on the p-type electrode layer and the etch stop layer; a conductive support layer disposed on the cover layer; and an n-type electrode layer disposed on the n-type semiconductor layer.

The p-type electrode layer may be disposed on a portion of the p-type semiconductor layer, and the p-type electrode layer may have a single-layer or multi-layer structure with an electrode metal and a reflective metal.

The p-type electrode layer may be disposed in an entire surface of the p-type semiconductor layer, and the light emitting device may further include a reflective layer disposed on a portion of the p-type electrode layer, and the etch stop layer may be spaced apart from the reflective layer. The p-type electrode layer may be formed of a transparent conductive material, and the reflective layer may be formed of a reflective metal. Also, the cover layer may surround the reflective layer.

The cover layer may be formed of a metal having excellent adhesiveness to the p-type electrode layer and the conductive support layer, and the light emitting device may further include a diffusion barrier layer disposed between the cover layer and the conductive support layer.

The conductive support layer may have a single-layer or multi-layer structure including one of a metal layer, a conductive ceramic layer, an impurity-doped semiconductor layer and a combination thereof, and the conductive ceramic layer may include one of Nb-doped SrTiO3, Al-doped ZnO, ITO, IZO and a combination thereof, and the semiconductor layer may include one of B-doped Si, As-doped Si, impurity-doped diamond, impurity-doped Ge and a combination thereof.

The light emitting device may further include a bonding layer disposed between the cover layer and the conductive support layer.

The light emitting device may further include a passivation layer disposed on sidewalls of the p-type semiconductor layer, the active layer, and the n-type semiconductor layer and on a portion of the n-type semiconductor layer, and the passivation layer may be further provided on an upper portion and a lower portion of the etch stop layer.

The light emitting device may further include an anti-reflective layer disposed on an upper or lower portion of the n-type electrode layer.

In accordance with another exemplary embodiment of the present invention, a method of manufacturing a light emitting device includes: sequentially forming an n-type semiconductor layer, an active layer, and a p-type semiconductor layer over an insulating substrate; forming a p-type electrode layer and an etch stop layer over the p-type semiconductor layer such that the p-type electrode layer and the etch stop layer are spaced apart from each other; forming a cover layer on the p-type electrode layer to surround the p-type electrode layer; removing the insulating substrate after forming a conductive support layer over the cover layer; etching portions of the n-type semiconductor layer, the active layer, and the p-type semiconductor layer to expose the etch stop layer; forming a passivation layer for surrounding the etched n-type semiconductor layer, the etched active layer, and the etched p-type semiconductor layer; and performing cutting after forming an n-type electrode layer on the etched n-type semiconductor layer.

The method may further include, after forming the n-type semiconductor layer, the active layer, and the p-type semiconductor layer, etching predetermined portions of the n-type semiconductor layer, the active layer, and the p-type semiconductor layer to expose the insulating substrate, and further include forming an insulating material including a photosensitive layer or an etch stop layer on the etched portions of the n-type semiconductor layer, the active layer, and the p-type semiconductor layer.

The p-type electrode layer may be formed on a portion of the p-type semiconductor layer by stacking an electrode metal and a reflective metal, and the method may further include, after the forming of the p-type electrode layer, heat-treating the p-type electrode layer in a nitrogen atmosphere or an atmosphere containing approximately 0.1% or more oxygen at a temperature ranging from approximately 250° C. to approximately 660° C. for a period of time ranging from approximately 30 seconds to approximately 30 minutes.

The p-type electrode layer may be formed on an entire surface of the p-type semiconductor layer, and the method may further include forming a reflective layer on the p-type electrode layer. The p-type electrode layer may be formed of a transparent conductive material, and the transparent conductive material may be heat-treated at a temperature ranging from approximately 200° C. to approximately 800° C.

The etch stop layer may be formed of a material having an etch selectivity different from those of the n-type semiconductor layer, the active layer, and the p-type semiconductor layer, and the etch stop layer may be formed of one selected from a group consisting of $MgO$, $Al_2O_3$, $ZrO_2$, $IrO_2$, $RuO_2$, $TaO_2$, $WO_3$, $VO_3$, $HfO_2$, $RhO_2$, $NbO_2$, $YO_3$, $ReO_3$ and a combination thereof.

The conductive support layer may be formed in a single layer or multi-layer structure including one of a metal layer, a conductive ceramic layer, an impurity-doped semiconductor layer and a combination thereof.

The metal layer may be formed using an electroplating or vacuum deposition method, and the metal layer, the conductive ceramic layer, or the impurity-doped semiconductor layer may be bonded to the cover layer through a bonding layer.

The bonding layer may be formed by applying an eutectic alloy containing approximately 80% of Au and approximately 20% of Sn on at least one of the cover layer and the conductive support layer, and then heat-treating the eutectic alloy at a temperature ranging from approximately 280° C. to approximately 400° C. for a period of time ranging from approximately 1 minute to approximately 120 minutes, or the bonding layer may be formed by applying an eutectic alloy containing approximately 10% of Au and approximately 90% of Sn on at least one of the cover layer and the conductive support layer, and then heat-treating the eutectic alloy at a temperature ranging from approximately 220° C. to approximately 300° C. for a period of time ranging from approximately 1 minute to approximately 120 minutes.

The method may further include forming an anti-reflective layer on an upper or lower portion of the n-type electrode layer, and the anti-reflective layer may be formed of one of ITO, ZnO, $SiO_2$, $Si_3N_4$, IZO and a combination thereof.

The method may further include performing a roughening process on a predetermined portion of the n-type semiconductor layer.

In accordance with exemplary embodiments of the present invention, a vertical-type light emitting device is manufactured by stacking an n-type semiconductor layer, an active layer, and a p-type semiconductor layer over a sapphire substrate, forming a p-type electrode layer on the p-type semiconductor layer, forming a cover layer to surround the p-type electrode layer, forming a conductive support layer, removing the sapphire substrate from the resultant structure including the n-type semiconductor layer through a method such as laser irradiation, and forming an n-type electrode layer on the n-type semiconductor layer.

In accordance with the exemplary embodiments of the present invention, a vertical-type light emitting device includes a conductive support layer in a lower portion thereof to effectively release heat generated when the device operates. This makes it possible to realize a high-power device.

Also, since photons generated in an active layer emit through an n-type semiconductor layer, an emitting path of the photons is shortened. Thus, the number of photons absorbed during the emission can be reduced. In addition, doping concentration of the n-type semiconductor layer can be increased to improve electric conductivity, thus reducing current spreading-resistance. As a result, optical power can be improved.

Also, a p-type electrode is thickly formed on a p-type semiconductor layer to reduce current density and improve the stability of a device.

BRIEF DESCRIPTION OF THE DRAWINGS

Exemplary embodiments can be understood in more detail from the following description taken in conjunction with the accompanying drawings, in which:

FIG. 1 is a cross-sectional view of a light emitting device in accordance with a first embodiment of the present invention;

FIG. 2 is a cross-sectional view of a light emitting device in accordance with a second embodiment of the present invention;

FIG. 3 is a cross-sectional view of a light emitting device in accordance with a third embodiment of the present invention;

FIG. 4 is a cross-sectional view of a light emitting device in accordance with a fourth embodiment of the present invention;

FIG. 5 is a cross-sectional view of a light emitting device in accordance with a fifth embodiment of the present invention;

FIG. 6 is a cross-sectional view of a light emitting device in accordance with a sixth embodiment of the present invention;

FIG. 7 is a cross-sectional view of a light emitting device in accordance with a seventh embodiment of the present invention;

FIG. 8 is a cross-sectional view of a light emitting device in accordance with an eighth embodiment of the present invention;

FIG. 9 is a graph illustrating etch selectivities of GaN and MgO;

FIGS. 10 through 16 are cross-sectional views illustrating one example of a method of manufacturing the light emitting device in accordance with the first embodiment of the present invention described in FIG. 1;

FIGS. 17 through 20 are cross-sectional views illustrating another example of a method of manufacturing the light emitting device in accordance with the first embodiment of the present invention described in FIG. 1;

FIGS. 21 through 24 are cross-sectional views illustrating still another example of a method of manufacturing the light emitting device in accordance with the first embodiment of the present invention described in FIG. 1;

FIGS. 25 through 28 are cross-sectional views illustrating a method of manufacturing the light emitting device in accordance with the second embodiment of the present invention described in FIG. 2;

FIGS. 29 through 32 are cross-sectional views illustrating a method of manufacturing the light emitting device in accordance with the third embodiment of the present invention described in FIG. 3;

FIGS. 33 through 36 are cross-sectional views illustrating one example of a method of manufacturing the light emitting device in accordance with the fourth embodiment of the present invention described in FIG. 4;

FIGS. 37 through 40 are cross-sectional views illustrating another example of a method of manufacturing the light emitting device in accordance with the fourth embodiment of the present invention described in FIG. 4;

FIGS. 41 through 44 are cross-sectional views illustrating a method of manufacturing the light emitting device in accordance with the fifth embodiment of the present invention described in FIG. 5;

FIGS. 45 through 48 are cross-sectional views illustrating another method of manufacturing the light emitting device in accordance with the fifth embodiment of the present invention described in FIG. 5;

FIGS. 49 through 52 are cross-sectional views illustrating a method of manufacturing the light emitting device in accordance with the sixth embodiment of the present invention described in FIG. 6;

FIGS. 53 through 56 are cross-sectional views illustrating a method of manufacturing the light emitting device in accordance with the seventh embodiment of the present invention described in FIG. 7;

FIGS. 57 through 60 are cross-sectional views illustrating one example of a method of manufacturing the light emitting device in accordance with the eighth embodiment of the present invention described in FIG. 8;

FIGS. 61 through 64 are cross-sectional views illustrating another example of a method of manufacturing the light emitting device in accordance with the eighth embodiment of the present invention described in FIG. 8;

FIG. 65 is an optical microscope image illustrating a light emitting state of a light emitting device in accordance with an exemplary embodiment of the present invention;

FIGS. 66 and 67 are graphs illustrating comparison in electrical and optical characteristics of a related art horizontal-type light emitting device with a vertical-type light emitting device in accordance with an exemplary embodiment of the present invention; and FIG. 68 is a graph illustrating comparison in optical power characteristics with respect to input current of a related art horizontal-type light emitting device with a vertical-type light emitting device in accordance with an exemplary embodiment of the present invention.

DETAILED DESCRIPTION OF THE ILLUSTRATED EMBODIMENTS

Hereinafter, specific embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present. Further, it will be understood that when a layer, a film, a region or a plate is referred to as being 'under' another one, it can be directly under the other one, and one or more intervening layers, films, regions or plates may also be present. In addition, it will also be understood that when a layer, a film, a region or a plate is referred to as being 'between' two layers, films, regions or plates, it can be the only layer, film, region or plate between the two layers, films, regions or plates, or one or more intervening layers, films, regions or plates may also be present.

FIG. 1 is a cross-sectional view of a light emitting device in accordance with a first embodiment of the present invention.

Referring to FIG. 1, the light emitting device in accordance with the first embodiment includes an n-type semiconductor layer 100, an active layer 200, a p-type semiconductor layer 300, a p-type electrode layer 400, an etch stop layer 500, a cover layer 600, a support layer 700, a passivation layer 800, and an n-type electrode layer 900.

The n-type semiconductor layer 100, for injecting electrons into the active layer 200, may be a GaN layer doped with n-type impurities, e.g., Si, of the concentration ranging from approximately $1 \times 10^{19}/cm^3$ to approximately $5 \times 10^{19}/cm^3$, but the present invention is not limited thereto. Thus, various semi-conductive materials may be used. That is, a nitride such as GaN, InN, or AlN (group III-V), or a compound having a predetermined ratio of the nitride may be used. Alternatively, the n-type semiconductor layer 100 may be formed in a multi-layer structure. In accordance with another embodiment, an n-type clad layer (not shown) may be further formed on the n-type semiconductor layer 100, in which the n-type clad layer may be formed of GaN, AlGaN, or InGaN. A roughening process may be performed on a portion of a side of the n-type semiconductor layer 100 where the n-type semiconductor layer 100 does not contact the active layer 200 and the electrode layer 900 is not formed, as shown in FIG. 1.

The active layer 200 is formed under the n-type semiconductor layer 100 and has a predetermined band gap and a quantum well where electrons and holes recombine. For example, the active layer 200 may be formed of InGaN undoped with impurities. Herein, a wavelength of light emitted through recombination of electrons and holes varies depending on a material forming the active layer 200. Thus, a semiconductor material included in the active layer 200 may be selected based on a target wavelength. Also, the active layer 200 may be formed in a multi-layer structure where a quantum well layer and a barrier layer are alternately stacked.

The p-type semiconductor layer 300 is formed under the active layer 200, and serves a role of injecting holes into the active layer 200. The p-type semiconductor layer 300 may be a GaN layer doped with p-type impurities, e.g., with an Mg concentration ranging from approximately $1 \times 10^{19}/cm^3$ to approximately $5 \times 10^{19}/cm^3$, but the present invention is not limited thereto. Thus, various semi-conducting materials, e.g., InGaN may be used. Alternatively, the p-type semiconductor layer 300 may be formed in a multi-layer structure. In accordance with another embodiment, a blocking layer (not shown) may be further provided between the active layer 200 and the p-type semiconductor layer 300. The blocking layer (not shown) prevents electrons provided from the n-type semiconductor layer 100 from overflowing without being recombined with holes in the active layer 200 and may be an AlGaN layer doped with a p-type impurity.

The p-type electrode layer 400, formed in a predetermined portion under the p-type semiconductor layer 300, acts as an electrode as well as reflecting light emitted from the active layer 200 by stacking an electrode metal and a reflective metal. That is, the p-type electrode layer 400 may be formed in a bilayered or trilayered structure by stacking an electrode metal and a reflective metal. The electrode metal includes any one of Ni, Pt, Ru, Ir, Rh, Ta, Mo, Ti, Ag, W, Cu, Cr, Pd, V, Co, Nb, Zr, and an alloy thereof. The reflective metal includes Ag or Al. Also, the p-type electrode layer 400 may have a bilayered structure of an electrode metal and a reflective metal, or a trilayered structure of a lower electrode metal, a reflective metal, and an upper electrode metal. In this case, the lower electrode metal may have a thickness ranging from approximately 0.1 nm to approximately 10 nm, a reflective metal may have a thickness ranging from approximately 10 nm to approximately 1000 nm, and the upper electrode may have a thickness ranging from approximately 1 nm to approximately 100 nm. The p-type electrode layer 400 may be heat-treated in a nitrogen atmosphere or an atmosphere containing approximately 0.1% or more oxygen at a temperature ranging from approximately 250° C. to approximately 660° C. for a period of time ranging from approximately 30 seconds to approximately 30 minutes.

The etch stop layer 500 has portions formed under the p-type semiconductor layer 300 and is spaced a predetermined distance from the p-type electrode layer 400. The etch stop layer 500 is formed of a material having etch selectivity to GaN forming the n-type semiconductor layer 100, the active layer 200, and the p-type semiconductor layer 300. For example, the etch stop layer 500 may be formed of an oxide such as $MgO$, $Al_2O_3$, $ZrO_2$, $IrO_2$, $RuO_2$, $TaO_2$, $WO_3$, $VO_3$, $HfO_2$, $RhO_2$, $NbO_2$, $YO_3$, or $ReO_3$.

The cover layer 600 fills a space between the p-type electrode layer 400 and the etch stop layer 500 and covers the p-type electrode layer 400 and the etch stop layer 500. The cover layer 600 prevents the p-type electrode layer 400 from being exposed to air and minimizes the phenomenon of electromigration where atoms of the p-type electrode layer 400 migrate in response to an electric field while current is applied. The cover layer 600 is formed of a metal having excellent adhesiveness to a lower material, and a diffusion barrier layer (not shown) may be further provided on the cover layer 600. The metal having excellent adhesiveness, forming the cover layer 600, may include Ti or Cr. The diffusion barrier layer may be formed of one of Pt, Pd, W, Ni, Ru, Mo, Ir, Rh, Ta, Hf, Ta, Zr, Nb, V, and an alloy thereof. Thus, the cover layer 600 may be formed in a single-layer or multi-layer structure. In case of the single-layer structure, the metal having excellent adhesiveness such as Ti or Cr may be used. In case of the multi-layer structure, the cover layer 600 may be formed by stacking the metal having excellent adhesiveness and the diffusion barrier layer, e.g., in a Ti/Pt or Ti/Pt/W/Pt structure. The cover layer 600 may have a thickness ranging from approximately 1 nm to approximately 1000 nm.

The support layer 700 is formed of a high thermal conductive material under the cover layer 600. Also, the support layer 700 may be formed of a conductive material including a metal or a conductive ceramic. The support layer 700 may be formed in a single layer structure, a bilayered structure including first and second support layers 710 and 720, or a multi-layer structure. For example, the support layer 700 may be formed of any one of Au, Ni, W, Mo, Cu, Al, Ta, Ag, Pt, Cr, and an alloy thereof. Alternatively, the support layer 700 may be formed by stacking at least two materials different from each other. The support layer 700 has a thickness ranging from approximately 0.5 nm to approximately 200 nm. The support layer 700 facilitates the release of heat generated during the operation of the device, thus improving the thermal stability of the device, so that a high-power device is realized.

The passivation layer 800 covers a range from portions of the etch stop layer 500 not contacting the p-type semiconductor layer 300 to sides of the n-type semiconductor layer 100, the active layer 200, and the p-type semiconductor layer 300. Furthermore, the passivation layer 800 covers a portion of a top surface of the n-type semiconductor layer 100. The passivation layer 800 is formed of an insulating material including a silicon oxide ($SiO_2$) or a silicon nitride ($Si_3N_4$).

The n-type electrode layer 900 is formed in a predetermined portion on the n-type semiconductor layer 100 by stacking Cr and Au, or stacking Ti and Al. An anti-reflective layer (not shown) may be formed of one of indium tin oxide (ITO), ZnO, $SiO_2$, $Si_3N_4$, indium zinc oxide (IZO) and a combination thereof on or under the n-type electrode layer 900.

As described above, the light emitting device in accordance with this embodiment includes the conductive support layer 700 disposed in a lower portion thereof, to facilitate the release of heat generated during the operation of the device, so that a high-power device is realized. Also, since photons generated in the active layer 200 are reflected by the p-type electrode layer 400 and emitted through the n-type semiconductor layer 100, an emitting path of the photons is shortened, thus reducing the number of photons absorbed during the emission. Also, the doping concentration of the n-type semiconductor layer 100 can be increased to improve the electric conductivity, thus reducing the current spreading-resistance. As a result, optical power can be enhanced. Also, the p-type electrode layer 400 is thickly formed to reduce current density and improve product stability.

FIG. 2 is a cross-sectional view of a light emitting device in accordance with a second embodiment of the present invention.

Referring to FIG. 2, the light emitting device in accordance with this embodiment includes an n-type semiconductor layer 100, an active layer 200, a p-type semiconductor layer 300, a p-type electrode layer 400, an etch stop layer 500, a cover layer 600, a support layer 700, a passivation layer 800, and an n-type electrode layer 900. The light emitting device in accordance with this embodiment differs from the light emitting device of FIG. 1 in that the cover layer 600 is formed to expose portions of the etch stop layer 500, and the passivation layer 800 is further formed on the portions of the etch stop layer 500 where the cover layer 600 is not formed.

FIG. 3 is a cross-sectional view of a light emitting device in accordance with a third embodiment of the present invention.

Referring to FIG. 3, the light emitting device in accordance with this embodiment includes an n-type semiconductor layer 100, an active layer 200, a p-type semiconductor layer 300, a p-type electrode layer 400, a reflective layer 450, an etch stop layer 500, a cover layer 600, a support layer 700, a passivation layer 800, and an n-type electrode layer 900. The light emitting device in accordance with this embodiment differs from the light emitting device of FIG. 1 in that the p-type electrode layer 400 is entirely formed on the p-type semiconductor layer 300, and the reflective layer 450 is further formed on a predetermined portion of the p-type electrode layer 400. That is, the p-type electrode layer 400 of the light emitting device of FIG. 1 includes the electrode metal and the reflective metal that are stacked, but the light emitting device in accordance with this embodiment includes the p-type electrode layer 400 and the reflective layer 450 that are separately formed.

The p-type electrode layer 400 is formed of a transparent conductive material under the p-type semiconductor layer 300. For example, the transparent conductive material may be a transparent conductive oxide such as indium tin oxide (ITO), indium zinc oxide (MO), aluminum doped zinc oxide (AZO), zinc oxide (ZnO) and a combination thereof. The reflective layer 450 is formed of a reflective metal under a portion of the p-type electrode layer 400. The etch stop layer 500 is formed under the p-type electrode layer 400 and spaced a predetermined distance from the reflective layer 450. The cover layer 600 is formed of a metal to fill a space between the reflective layer 450 and the etch stop layer 500 and cover the reflective layer 450 and the etch stop layer 500.

FIG. 4 is a cross-sectional view of a light emitting device in accordance with a fourth embodiment of the present invention.

Referring to FIG. 4, the light emitting device in accordance with this embodiment includes an n-type semiconductor layer 100, an active layer 200, a p-type semiconductor layer 300, a p-type electrode layer 400, a reflective layer 450, an etch stop layer 500, a cover layer 600, a support layer 700, a passivation layer 800, and an n-type electrode layer 900. The light emitting device in accordance with this embodiment differs from the light emitting device of FIG. 3 in that the p-type electrode layer 400 and the reflective layer 450 are stacked in a certain portion under the p-type semiconductor layer 300.

The p-type electrode layer 400 is disposed in the certain portion under the p-type semiconductor layer 300, and the reflective layer 450 is disposed under the p-type electrode layer 400. The etch stop layer 500 is spaced apart from the p-type electrode layer 400, partially contacts a lower surface of the p-type semiconductor layer 300 and may have the same thickness as that of the p-type electrode layer 400. The cover layer 600 fills a space between the p-type electrode layer 400 and the etch stop layer 500 and covers the etch stop layer 500 and the reflective layer 450 to have a planarized surface.

FIG. 5 is a cross-sectional view of a light emitting device in accordance with a fifth embodiment of the present invention.

Referring to FIG. 5, the light emitting device in accordance with this embodiment includes an n-type semiconductor layer 100, an active layer 200, a p-type semiconductor layer 300, a p-type electrode layer 400, an etch stop layer 500, a cover layer 600, a bonding layer 650, a support substrate 750, a passivation layer 800, and an n-type electrode layer 900. That is, the light emitting device in accordance with this embodiment differs from the light emitting device of FIG. 1 in that the support substrate 750 instead of the support layer 700 is bonded to the cover layer 600 through the bonding layer 650.

For example, the bonding layer 650, for bonding the cover layer 600 to the support substrate 750, may be formed of an AuSn-based eutectic alloy containing, e.g., 80% of Au and 20% of Sn, or 10% of Au and 90% of Sn. Also, the bonding layer 650 may be formed in a bilayered structure including first and second bonding layers 651 and 652. The first bonding layer 651 is formed on the cover layer 600, and the second bonding layer 652 is formed on the support substrate 750. Then, the first and second bonding layers 651 and 652 are bonded to each other such that the cover layer 600 and the support substrate 750 are bonded. The bonding layer 650 has a thickness ranging from approximately 0.1 µm to approximately 10 µm. When an alloy containing 80% of Au and 20% of Sn is used, the bonding process is performed through a heat-treating process with a temperature ranging from approximately 280° C. to approximately 400° C. and a period of time ranging from approximately 1 minute to approximately 120 minutes. When an alloy containing 10% of Au and 90% of Sn is used, the bonding process is performed through a heat-treating process with a temperature ranging from approximately 220° C. to approximately 300° C. and a period of time ranging from approximately 1 minute to approximately 120 minutes. The support substrate 750 includes a conductive substrate such as a metal substrate, a conductive ceramic substrate, or a semiconductor substrate. The metal substrate may be formed of single metal elements such as Mo, Ta, Ni, W, Cu, Al, or Ag. Alternatively, the metal substrate may be formed of an alloy of the above metal elements, i.e., Mo, Ta, Ni, W, Cu, Al, or Ag, and other elements. The conductive ceramic substrate may be formed of one of a Nb-doped $SrTiO_3$, an Al-doped ZnO, indium tin oxide (ITO), indium zinc oxide (IZO) and a combination thereof. The semiconductor substrate may be an impurity-doped semiconductor substrate formed of one of B-doped Si, As-doped Si, impurity-doped diamond, impurity-doped Ge and a combination thereof. The support substrate 750 has a thickness ranging from approximately 5 µm to approximately 200 µm.

FIG. 6 is a cross-sectional view of a light emitting device in accordance with a sixth embodiment of the present invention.

Referring to FIG. 6, the light emitting device in accordance with this embodiment includes an n-type semiconductor layer 100, an active layer 200, a p-type semiconductor layer 300, a p-type electrode layer 400, an etch stop layer 500, a cover layer 600, a bonding layer 650, a support substrate 750, a passivation layer 800, and an n-type electrode layer 900. The cover layer 600 is formed to expose portions of the etch stop layer 500, and the passivation layer 800 is further formed on the portions of the etch stop layer 500 where the cover layer 600 is not formed. That is, the light emitting device in accordance with this embodiment differs from the light emitting device of FIG. 2 in that the support substrate 750 instead of the support layer 700 is bonded to the cover layer 600 through the bonding layer 650.

FIG. 7 is a cross-sectional view of a light emitting device in accordance with a seventh embodiment of the present invention.

Referring to FIG. 7, the light emitting device in accordance with this embodiment includes an n-type semiconductor layer 100, an active layer 200, a p-type semiconductor layer 300, a p-type electrode layer 400, a reflective layer 430, an etch stop layer 500, a cover layer 600, a bonding layer 650, a support substrate 750, a passivation layer 800, and an n-type electrode layer 900. That is, the light emitting device in accordance with this embodiment differs from the light emitting device of FIG. 3 in that the support substrate 750 instead of the support layer 700 is bonded to the cover layer 600 through the bonding layer 650

FIG. 8 is a cross-sectional view of a light emitting device in accordance with an eighth embodiment of the present invention.

Referring to FIG. 8, the light emitting device in accordance with this embodiment includes an n-type semiconductor layer 100, an active layer 200, a p-type semiconductor layer 300, a p-type electrode layer 400, a reflective layer 450, an etch stop layer 500, a cover layer 600, a bonding layer 650, a support substrate 750, a passivation layer 800, and an n-type electrode layer 900. That is, the light emitting device in accordance with this embodiment differs from the light emitting device of FIG. 4 in that the support substrate 750 instead of the support layer 700 is bonded to the cover layer 600 through the bonding layer 650.

FIG. 9 is a graph illustrating etch selectivities of GaN and MgO. In accordance with the present invention, MgO is used to form an etch stop layer, and GaN is used to form an n-type semiconductor layer, an active layer, and a p-type semiconductor layer.

Referring to FIG. 9, photosensitive patterns were respectively formed on a first substrate where GaN is deposited thereon and a second substrate where GaN and MgO are sequentially deposited thereon, and then etch thickness with respect to etch time was measured by etching the resultant substrates with a mixed etch gas of $Cl_2$ and $BCl_3$. A reactive ion etching (RIE) method using an inductive coupled plasma (ICP) apparatus was used as an etching process. A result of the measurement showed that GaN was etched by approximately 180 nm per minute, but MgO was etched by approximately 45 nm for 18 minutes, i.e., an etch rate of MgO was approximately 2.5 nm per minute. That is, the etch selectivity of GaN:MgO was 72:1. Thus, a vertical-type light emitting device can be effectively manufactured using MgO as the etch stop layer in accordance with the present invention.

Hereinafter, a method of manufacturing a light emitting device will be described in accordance with various embodiments of the present invention.

FIGS. 10 through 16 are cross-sectional views illustrating one example of a method of manufacturing the light emitting device in accordance with the first embodiment of the present invention described in FIG. 1.

Referring to FIG. 10, an n-type semiconductor layer 100, an active layer 200, and a p-type semiconductor layer 300 are sequentially stacked on a substrate, e.g., a sapphire substrate 50. The n-type semiconductor layer 100, the active layer 200, and the p-type semiconductor layer 300 may be formed of n-type doped GaN, undoped InGaN, and p-type doped GaN, respectively. The n-type semiconductor layer 100, the active layer 200, and the p-type semiconductor layer 300 may be formed using various deposition or epitaxy methods including metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) and so on. Also, the n-type semiconductor layer 100, the active layer 200, and the p-type semiconductor layer 300 may be formed in situ. For example, the sapphire substrate 50 is loaded in an MOCVD chamber, the temperature of the chamber is set between approximately 900° C. and approximately 1000° C., and then trimethylgallium (TMGa) as a gallium (Ga) source, ammonia ($NH_3$) as a nitrogen source, and $SiH_4$ or $SiH_6$ as n-type impurities are introduced to form a silicon-doped GaN layer. Alternatively, in order to form the n-type semiconductor layer 100 using InN or AlN instead of GaN, an indium or aluminum source is introduced to the chamber. Then, the temperature of the chamber is set between approximately 700° C. and approximately 850° C., and trimethylindium (TMIn) or triethylindium (TEIn) as an indium source, an gallium source, and a nitrogen source are introduced to form an undoped InGaN layer. Subsequently, the temperature of the chamber is set between approximately 900° C. and approximately 1100° C., and an gallium source, a nitrogen source, and biscyclopentadi-enylmagnesium ($Cp_2Mg$) as p-type impurities are introduced to form a Mg-doped GaN layer.

Referring to FIG. 11, a plurality of p-type electrode layers 400, spaced apart from each other, are formed on the p-type semiconductor layer 300, and then etch stop layers 500 are formed between the p-type electrode layers 400.

First, the p-type electrode layers 400 are formed by forming a metal layer using vacuum deposition, heat-treating the metal layer, and patterning the heated metal layer. The p-type electrode layers 400 may be formed of a metal electrode and a reflective metal that are stacked to form a bilayered or trilayered structure. The metal electrode is formed of any one of Ni, Pt, Ru, Ir, Rh, Ta, Mo, Ti, Ag, W, Cu, Cr, Pd, V, Co, Nb, Zr, and an alloy thereof and the reflective metal includes Ag or Al. A bilayered structure including the metal electrode and the reflective metal, or a trilayered structure including the metal electrode, the reflective metal, and the metal electrode may be formed. The p-type electrode layers 400 may be heat-treated in a nitrogen atmosphere or an atmosphere containing approximately 0.1% or more oxygen at a temperature ranging from approximately 250° C. to approximately 660° C. for a period of time ranging from approximately 30 seconds to approximately 30 minutes. Then, the p-type electrode layers 400 are formed by forming a photosensitive layer (not shown) on the metal layer having a stack structure, patterning the photosensitive layer using photo and exposure processes and patterning the metal layer using the patterned photosensitive layer as a mask Then, in order to form the etch stop layers 500, a photosensitive layer (not shown) is formed on an entire upper portion of a resultant structure, and then the photosensitive layer is patterned through photo and development processes. The photosensitive layer is patterned to expose predetermined portions of the p-type semiconductor layer 300 between the p-type electrode layers 400. Then, an etch stop film is formed on an entire upper portion including the patterned photosensitive layer using vacuum deposition. The etch stop film is formed of a material having a different etch rate from that of GaN forming the n-type semiconductor layer 100, the active layer 200, and the p-type semiconductor layer 300. For example, the etch stop film may be formed of an oxide such as MgO, $Al_2O_3$, $ZrO_2$, $IrO_2$, $RuO_2$, $TaO_2$, $WO_3$, $VO_3$, $HfO_2$, $RhO_2$, $NbO_2$, $YO_3$, or $ReO_3$. Then, dipping is performed with acetone to lift off a photosensitive pattern and portions of the etch stop film on the photosensitive pattern. Thus, the etch stop layers 500 remain between the p-type electrode layers 400 and are spaced apart from the p-type electrode layers 400. Alternatively, the etch stop layers 300 may be formed between the p-type electrode layers 400, e.g., by depositing MgO, applying a photosensitive layer, patterning the photosensitive layer through photo and development processes using a predetermined mask, and then etching MgO exposed by a photosensitive pattern using a solution such as HCl.

Referring to FIG. 12, a cover layer 600 is formed on the p-type electrode layers 400 and the etch stop layers 500 while filling a space between the p-type electrode layers 400 and the etch stop layers 500. The cover layer 600 prevents the p-type electrode layers 400 from being exposed to air and minimizes the phenomenon of electro-migration, referring that atoms of the p-type electrode layers 400 migrate in response to an electric field while current is applied. The cover layer 600 is formed of a metal having excellent adhesiveness to a support layer 700 that will be formed later. A diffusion barrier layer (not shown) may be further formed on the cover layer 600. The cover layer 600 may be formed of a material, e.g., Ti or Cr, having excellent adhesiveness to a metal. The diffusion barrier layer on the cover layer 600 may be formed of Pt, Pd, W, Ni, Ru, Mo, Ir, Rh, Ta, Hf, Ta, Zr, Nb, or V. The cover layer 600 may be formed in a single layer or multi-layer structure. In case of the single layer structure, the metal having excellent adhesiveness such as Ti or Cr may be used. In case of the multi-layer structure, the cover layer 600 may be formed by stacking the metal having excellent adhesiveness and the diffusion barrier layer, e.g., in a Ti/Pt or Ti/Pt/W/Pt structure. The cover layer 600 may have a thickness ranging from approximately 1 nm to approximately 1000 nm.

Referring to FIG. 13, the support layer 700 is formed on the cover layer 600. The support layer 700 may be formed in a single layer or multi-layer structure and may be formed in a bilayered structure by stacking first and second support layers 710 and 720. For example, the support layer 700 may be formed of any one of Au, Ni, W, Mo, Cu, Al, Ta, Ag, Pt, Cr, and an alloy thereof. Alternatively, the support layer 700 may be formed by stacking at least two materials different from each other. In case of a metal, the support layer 700 is formed using vacuum deposition such as thermal evaporator, e-beam evaporator and sputter, or electroplating and has a thickness ranging from approximately 0.5 nm to approximately 200 nm. Then, portions of the second support layer 720 are removed using photo and etching processes. At this point, there remain portions of the second support layer 720 that overlap the p-type electrode layers 400 and portions of the etch stop layers 500 disposed on both sides of the p-type electrode layers 400. That is, portions of the second support layer 720 over the etch stop layers 500 are mostly removed.

Referring to FIG. 14, a laser is irradiated through the sapphire substrate 50 to separate the sapphire substrate 50 from the n-type semiconductor layer 100. The support layer 700 prevents breakage of the GaN layers when the sapphire substrate 50 is separated through the irradiation of the laser. Alternatively, grinding or chemical polishing may be employed to remove the sapphire substrate 50. Then, portions except for light emitting device regions are etched. That is, a photosensitive layer is formed on the n-type semiconductor layer 100, and then a photosensitive pattern is formed using photo and development processes. The photosensitive pattern is formed to expose portions of the n-type semiconductor layer 100 corresponding to the etch stop layers 500. Then, the n-type semiconductor layer 100, the active layer 200, and the p-type semiconductor layer 300 are etched using dry etching with a $Cl_2$ gas or a mixed gas of $Cl_2$ and $BCl_3$, thereby exposing the etch stop layers 500. That is, the etching is performed until the etch stop layers 500 formed of a material, e.g., MgO, is exposed, wherein MgO has an etch rate different from that of GaN forming the n-type semiconductor layer 100, the active layer 200, and the p-type semiconductor layer 300.

Referring to FIG. 15, an insulating layer such as a silicon oxide ($SiO_2$) or a silicon nitride ($Si_3N_4$) is deposited on upper portions and side portions of separated devices to form a passivation layer 800. The passivation layer 800 may have a thickness ranging from approximately 0.05 μm to approximately 5.0 μm and may be formed using a plasma-enhanced chemical vapor deposition (PECVD) method. Then, the passivation layer 800 is selectively removed to expose upper portions of the n-type semiconductor layer 100, and the n-type electrode layer 900 is then formed on the exposed upper portions of the n-type semiconductor layer 100. The n-type electrode layer 900 is formed in a stack structure including Cr and Au, or Ti and Al. For example, a Cr layer is formed to have a thickness ranging from approximately 10 nm to approximately 200 nm, an Au layer is formed to have a thickness ranging from approximately 300 nm to approximately 1000 nm, to form the n-type electrode layer 900. An anti-reflective layer (not shown) may be formed of indium tin oxide (ITO), ZnO, $SiO_2$, $Si_3N_4$, indium zinc oxide (IZO) and a combination thereof on or under the n-type electrode layer 900.

Referring to FIG. 16, a roughening process is performed on exposed surfaces of the n-type semiconductor layer 100. The roughening process is performed by dipping the light emitting devices in a KOH or NaOH solution, and then performing UV irradiation, so that the exposed surfaces of the n-type semiconductor layer 100 are etched with a predetermined direction, and thus roughened. Thereafter, the cover layer 600 and the first support layer 710 are cut between the light emitting device regions using a dicing or laser-cutting process to complete the forming of a chip.

Various modifications can be made in the method of manufacturing the light emitting device in accordance with the first embodiment of the present invention. Hereinafter, various embodiments will be mainly described according to different parts from the above manufacturing method.

FIGS. 17 through 20 are cross-sectional views illustrating another example of a method of manufacturing the light emitting device in accordance with the first embodiment of the present invention described in FIG. 1.

Referring to FIG. 17, an n-type semiconductor layer 100, an active layer 200, and a p-type semiconductor layer 300 are sequentially formed on a sapphire substrate 50. Predetermined portions of the n-type semiconductor layer 100, the active layer 200, and the p-type semiconductor layer 300 are etched to expose the sapphire substrate 50. That is, a photosensitive layer (not shown) is formed on an entire structure and patterned using photo and development processes, and then the p-type semiconductor layer 300, the active layer 200, and the n-type semiconductor layer 100 are etched using the patterned photosensitive layer as an etch mask. Etch widths may be less than gaps between light emitting device regions. After then, p-type electrode layers 400 are formed on predetermined upper portions of the p-type semiconductor layer 300.

Referring to FIG. 18, etch stop layers 500 are formed on exposed portions of the sapphire substrate 50 and on sidewalls of the n-type semiconductor layer 100, the active layer 200, and the p-type semiconductor layer 300 and on predetermined upper portions of the p-type semiconductor layer 300. The etch stop layers 500 on the upper portions of the p-type semiconductor layer 300 are spaced a predetermined distance from the p-type electrode layers 400. Thereafter, a cover layer 600 is formed on an entire upper portion including the p-type electrode layers 400 and the etch stop layers 500, and then a first support layer 710 and a second support layer 720 are formed on the cover layer 600. Predetermined portions of the second support layer 720 are removed using certain photo and etching processes. As a result, remainder portions of the second support layer 720 have the same widths as that of the light emitting device.

Referring to FIG. 19, the substrate 50 is removed from the n-type semiconductor layer 100 using a method such as laser irradiation, grinding, or chemical polishing. Then, given portions of the n-type semiconductor layer 100, the active layer 200, and the p-type semiconductor layer 300 are etched to define the light emitting device regions. The etching process is finished on the etch stop layers 500 disposed on the p-type semiconductor layer 300. At this time, the n-type semiconductor layer 100, the active layer 200, and the p-type semiconductor layer 300 are etched inward with respect to portions of the etch stop layers 500 formed on the sidewalls thereof, thus the portions of the etch stop layers 500 formed on the sidewalls are removed. Then, a passivation layer 800 is formed on sidewalls of the etched n-type semiconductor layer 100, the etched active layer 200, and the etched p-type semiconductor layer 300 and on predetermined upper portions of the etched n-type semiconductor layer 100.

Referring to FIG. 20, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600 and the first support layer 710 are cut between the light emitting device regions using a dicing or laser-cutting process to complete the forming of a chip.

FIGS. 21 through 24 are cross-sectional views illustrating still another example of a method of manufacturing the light emitting device in accordance with the first embodiment of the present invention described in FIG. 1.

Referring to FIG. 21, an n-type semiconductor layer 100, an active layer 200, and a p-type semiconductor layer 300 are sequentially formed on a sapphire substrate 50. Predetermined portions of the n-type semiconductor layer 100, the active layer 200, and the p-type semiconductor layer 300 are etched to expose the sapphire substrate 50. The etching process is performed to have widths defining light emitting device regions. P-type electrode layers 400 are formed on predetermined upper portions of the p-type semiconductor layer 300, and then photosensitive layers 410 or a photosensitive organic material is formed to fill the etched portions. Instead of the photosensitive layers 410 or the photosensitive organic material, there may be formed a material having a different etch selectivity from those of the n-type semiconductor layer 100, the active layer 200, the p-type semiconductor layer 300, and etch stop layers 500.

Referring to FIG. 22, the etch stop layers 500 are formed on predetermined upper portions of the p-type semiconductor layer 300. The etch stop layers 500 are spaced a predetermined distance from the p-type electrode layers 400 and disposed on the photosensitive layers 410. Thereafter, a cover layer 600 is formed on an entire upper portion including the p-type electrode layers 400 and the etch stop layers 500, and then a first support layer 710 and a second support layer 720 are formed on the cover layer 600. Predetermined portions of the second support layer 720 are removed using predetermined photo and etching processes.

Referring to FIG. 23, the substrate 50 is removed from the n-type semiconductor layer 100 using a method such as laser irradiation, grinding, or chemical polishing. After that, the photosensitive layers 410 are removed and a passivation layer 800 is formed on portions where the photosensitive layers 410 are removed, i.e., on sidewalls of the n-type semiconductor layer 100, the active layer 200, and the p-type semiconductor layer 300, which are exposed by the removing of the photosensitive layers 410, and on predetermined upper portions of the n-type semiconductor layer 100.

Referring to FIG. 24, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600 and the first support layer 710 are cut between the light emitting device regions using a dicing or laser-cutting process to complete the forming of a chip.

FIGS. 25 through 28 are cross-sectional views illustrating a method of manufacturing the light emitting device in accordance with the second embodiment of the present invention described in FIG. 2.

Referring to FIG. 25, an n-type semiconductor layer 100, an active layer 200, and a p-type semiconductor layer 300 are sequentially formed on a sapphire substrate 50. Predetermined portions of the n-type semiconductor layer 100, the active layer 200, and the p-type semiconductor layer 300 are etched to expose the sapphire substrate 50. The etching process is performed to have widths defining light emitting device regions. Then, p-type electrode layers 400 and etch stop layers 500 are formed on predetermined upper portions of the p-type semiconductor layer 300, wherein the etch stop layers 500 are spaced a predetermined distance from the p-type electrode layers 400.

Referring to FIG. 26, a cover layer 600 is formed on upper portions of the p-type electrode layers 400 and the etch stop layers 500 of the separated light emitting device regions, and then a first support layer 710 and a second support layer 720 are formed on an entire structure. Predetermined portions of the second support layer 720 are removed using predetermined photo and etching processes.

Referring to FIG. 27, the substrate 50 is removed from the n-type semiconductor layer 100 using a method such as laser irradiation, grinding, or chemical polishing. Then, a passivation layer 800 is formed on sidewalls of the n-type semiconductor layer 100, the active layer 200, and the p-type semiconductor layer 300 and on predetermined upper portions of the n-type semiconductor layer 100. The passivation layer 800 is also formed in a space between the etch stop layers 500 and the first support layer 710.

Referring to FIG. 28, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600 and the first support layer 710 are cut between the light emitting device regions using a dicing or laser-cutting process to complete the forming of a chip.

FIGS. 29 through 32 are cross-sectional views illustrating a method of manufacturing the light emitting device in accordance with the third embodiment of the present invention described in FIG. 3.

Referring to FIG. 29, an n-type semiconductor layer 100, an active layer 200, and a p-type semiconductor layer 300 are sequentially formed on a sapphire substrate 50. Then, a p-type electrode layer 400 is formed on the p-type semiconductor layer 300. The p-type electrode layer 400 is formed of a transparent conductive material, e.g., a transparent conductive oxide, using a vacuum deposition process. The transparent conductive oxide includes ITO, IZO, AZO, or ZnO. The vacuum deposition process includes sputtering, e-beam evaporator, or thermal evaporator process. Then, the transparent conductive oxide is heat-treated in a gas atmosphere containing approximately 10% or more oxygen at a temperature ranging from approximately 200° C. to approximately 800° C. for approximately 1 minute or more, thereby forming a transparent conductive oxide layer having ohmic characteristics as the p-type electrode layer 400. Then, reflective layers 450 are formed of a reflective metal such as Ag or Al on predetermined upper portions of the p-type electrode layer 400. Etch stop layers 500, spaced a predetermined distance from the reflective layers 450, are also formed on the p-type electrode layer 400.

Referring to FIG. 30, a cover layer 600 is formed on an entire upper portion including the reflective layers 450 and the etch stop layers 500, and then a first support layer 710 and a second support layer 720 are formed on the cover layer 600. Predetermined portions of the second support layer 720 are removed using predetermined photo and etching processes.

Referring to FIG. 31, the substrate 50 is removed from the n-type semiconductor layer 100 using a method such as laser irradiation, grinding, or chemical polishing. Then, predetermined portions of the n-type semiconductor layer 100, the active layer 200, and the p-type semiconductor layer 300 are removed using an etching process to define the light emitting device regions. The etching process is finished on the etch stop layers 500 disposed over the p-type semiconductor layer 300. Then, a passivation layer 800 is formed on sidewalls of the n-type semiconductor layer 100, the active layer 200, and the p-type semiconductor layer 300 and on predetermined upper portions of the n-type semiconductor layer 100.

Referring to FIG. 32, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600 and the first support layer 710 are cut between the light emitting device regions using a dicing or laser-cutting process to complete the forming of a chip.

FIGS. 33 through 36 are cross-sectional views illustrating one example of a method of manufacturing the light emitting device in accordance with the fourth embodiment of the present invention described in FIG. 4.

Referring to FIG. 33, an n-type semiconductor layer 100, an active layer 200, and a p-type semiconductor layer 300 are sequentially formed on a sapphire substrate 50. Then, predetermined portions of the p-type semiconductor layer 300, the active layer 200, and the n-type semiconductor layer 100 are etched to expose the sapphire substrate 50. Next, p-type electrode layers 400 are formed on predetermined upper portions of the p-type semiconductor layer 300. That is, a transparent conductive oxide is formed on the p-type semiconductor layer 300, and then selectively removed using photo and etching processes to form the p-type electrode layers 400. The etching process may be a wet etching process with a HCl diluted solution or a dry etching process with a $CF_4$ gas. Then, reflective layers 450 are formed on upper portions of the p-type electrode layers 400. The reflective layers 450 are formed by forming a photosensitive layer (not shown) on an entire structure, patterning the photosensitive layer to expose the p-type electrode layers 400, depositing a reflective metal, and then removing the photosensitive layer and the reflective metal on the photosensitive layer using a lift-off process. Alternatively, the reflective layers 450 may be formed by depositing a reflective metal on the entire structure, forming a photosensitive pattern to expose portions of the reflective metal on the p-type electrode layers 400, and then etching the reflective metal.

Referring to FIG. 34, etch stop layers 500 are formed on exposed portions of the sapphire substrate 50, on sidewalls of the n-type semiconductor layer 100, the active layer 200, and the p-type semiconductor layer 300 and on predetermined upper portions of the p-type semiconductor layer 300. The etch stop layers 500 on the upper portions of the p-type semiconductor layer 300 are spaced a predetermined distance from the p-type electrode layers 400. Thereafter, a cover layer 600 is formed on an entire upper portion of the resultant structure including the p-type electrode layers 400 and the etch stop layers 500, and then a first support layer 710 and a second support layer 720 are formed on the cover layer 600. Predetermined portions of the second support layer 720 are removed using predetermined photo and etching processes, so that remainders of the second support layer 720 have the same widths as that of the light emitting device.

Referring to FIG. 35, the substrate 50 is removed from the n-type semiconductor layer 100 using a method such as laser irradiation, grinding, or chemical polishing. Then, predetermined portions of the n-type semiconductor layer 100, the active layer 200, and the p-type semiconductor layer 300 are removed using an etching process to define the light emitting device regions. The etching process is finished on the etch stop layers 500 disposed on the p-type semiconductor layer 300. Also, the n-type semiconductor layer 100, the active layer 200, and the p-type semiconductor layer 300 are etched inward with respect to portions of the etch stop layers 500 formed on the sidewalls thereof, thus the portions of the etch stop layers 500 formed on the sidewalls are removed. Then, a passivation layer 800 is formed on sidewalls of the n-type semiconductor layer 100, the active layer 200, and the p-type semiconductor layer 300 and on predetermined upper portions of the n-type semiconductor layer 100.

Referring to FIG. 36, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600 and the first support layer 710 are cut between the light emitting device regions using a dicing or laser-cutting process to complete the forming of a chip.

FIGS. 37 through 40 are cross-sectional views illustrating another example of a method of manufacturing the light emitting device in accordance with the fourth embodiment of the present invention described in FIG. 4.

Referring to FIG. 37, an n-type semiconductor layer 100, an active layer 200, and a p-type semiconductor layer 300 are sequentially formed on a sapphire substrate 50. Then, predetermined portions of the p-type semiconductor layer 300, the active layer 200, and the n-type semiconductor layer 100 are etched to expose the sapphire substrate 50. The etching process is performed to have widths defining light emitting device regions. Photosensitive layers 410 or a photosensitive organic material is formed to fill the etched portions. Next, p-type electrode layers 400 and reflective layers 450 are formed on predetermined upper portions of the p-type semiconductor layer 300. Subsequently, etch stop layers 500 are formed on predetermined upper portions of the p-type semiconductor layer 300. That is, the etch stop layers 500 are spaced a predetermined distance from the p-type electrode layers 400 and disposed on the photosensitive layers 410.

Referring to FIG. 38, a cover layer 600 is formed on an entire upper portion of a resultant structure including the p-type electrode layers 400, the reflective layers 450 and the etch stop layers 500, and then a first support layer 710 and a second support layer 720 are formed on the cover layer 600. Predetermined portions of the second support layer 720 are removed using predetermined photo and etching processes.

Referring to FIG. 39, the substrate 50 is removed from the n-type semiconductor layer 100 using a method such as laser irradiation, grinding, or chemical polishing. After that, the photosensitive layers 410 are removed, and then a passivation layer 800 is formed on sidewalls of the n-type semiconductor layer 100, the active layer 200, and the p-type semiconductor layer 300, which are exposed by the removing of the photosensitive layers 410, and on predetermined upper portions of the n-type semiconductor layer 100.

Referring to FIG. 40, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600 and the first support layer 710 are cut between the light emitting device regions using a dicing or laser-cutting process to complete the forming of a chip.

FIGS. 41 through 44 are cross-sectional views illustrating a method of manufacturing the light emitting device in accordance with the fifth embodiment of the present invention described in FIG. 5.

Referring to FIG. 41, an n-type semiconductor layer 100, an active layer 200, and a p-type semiconductor layer 300 are sequentially formed on a sapphire substrate 50 After that, p-type electrode layers 400 are formed on predetermined upper portions of the p-type semiconductor layer 300, and etch stop layers 500 are then formed to be spaced a predetermined distance from the p-type electrode layers 400 on given upper portions of the p-type semiconductor layer 300

Referring to FIG. 42, a cover layer 600 is formed on an entire portion of the resultant structure including the p-type electrode layers 400 and the etch stop layers 500, and then a first bonding layer 651 is formed on the cover layer 600. After that, a second bonding layer 652 is formed on a support substrate 750, and then the first and second bonding layers 651 and 652 are bonded to each other to bond the cover layer 600 and the support substrate 750. For example, the cover layer 600 and the support substrate 750 are respectively bonded through the first and second bonding layers 651 and 652 while an AuSn based eutectic alloy, e.g., an AuSn-based eutectic alloy containing 80% of Au and 20% of Sn is applied, and the bonding process is performed in a pressure of approximately 1 atm or more and at a temperature ranging from approximately 280° C. to approximately 400° C. for a period of time ranging from approximately 5 minutes to approximately 60 minutes. Alternatively, in case where an AuSn-based eutectic alloy containing 10% of Au and 90% of Sn is applied for the first and second bonding layers 651 and 652, the bonding process is performed through a heat-treating process with a temperature ranging from approximately 220° C. to approximately 300° C. for a period of time ranging from approximately 1 minute to approximately 120 minutes. The support substrate 750 includes a conductive substrate. For example, the support substrate 750 may include a metal substrate, a conductive ceramic substrate, or a semiconductor substrate. The metal substrate may be formed of single metal elements such as Mo, Ta, Ni, W, Cu, Al, or Ag. Alternatively, the metal substrate may be formed of an alloy of the above metal elements, i.e., Mo, Ta, Ni, W, Cu, Al, or Ag, and other elements. The conductive ceramic substrate may be formed of Nb-doped $SrTiO_3$, Al-doped ZnO, ITO, or IZO. The semiconductor substrate may be an impurity-doped semiconductor substrate formed of one of B-doped Si, As-doped Si, impurity-doped diamond, impurity-doped Ge and a combination thereof.

Referring to FIG. 43, the substrate 50 is removed from the n-type semiconductor layer 100 using a method such as laser irradiation, grinding, or chemical polishing. After that, given portions of the n-type semiconductor layer 100, the active layer 200, and the p-type semiconductor layer 300 are etched to define the light emitting device regions. The etching process is finished on the etch stop layers 500 disposed on the p-type semiconductor layer 300. Then, a passivation layer 800 is formed on sidewalls of the n-type semiconductor layer 100, the active layer 200, and the p-type semiconductor layer 300, and on predetermined upper portions of the n-type semiconductor layer 100.

Referring to FIG. 44, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600, the first and second bonding layers 651 and 652, and the support substrate 750 are cut between the light emitting device regions using a dicing or laser-cutting process to complete the forming of a chip.

FIGS. 45 through 48 are cross-sectional views illustrating another method of manufacturing the light emitting device in accordance with the fifth embodiment of the present invention described in FIG. 5.

Referring to FIG. 45, an n-type semiconductor layer 100, an active layer 200, and a p-type semiconductor layer 300 are sequentially formed on a sapphire substrate 50. Then, predetermined portions of the p-type semiconductor layer 300, the active layer 200, and the n-type semiconductor layer 100 are etched to expose the sapphire substrate 50. Next, p-type electrode layers 400 are formed on predetermined upper portions of the p-type semiconductor layer 300.

Referring to FIG. 46, etch stop layers 500 are formed on exposed portions of the sapphire substrate 50 and on sidewalls of the n-type semiconductor layer 100, the active layer 200, and the p-type semiconductor layer 300 and on predetermined upper portions of the p-type semiconductor layer 300. The etch stop layers 500 on the upper portions of the p-type semiconductor layer 300 are spaced a predetermined distance from the p-type electrode layers 400. Thereafter, a cover layer 600 is formed on an entire portion of a resultant structure including the p-type electrode layers 400 and the etch stop layers 500. Then, a first bonding layer 651 is formed on the cover layer 600 and a second bonding layer 652 is formed on a support substrate 750. The first and second bonding layers 651 and 652 are bonded to each other to bond the cover layer 600 and the support substrate 750.

Referring to FIG. 47, the substrate 50 is removed from the n-type semiconductor layer 100 using a method such as laser irradiation, grinding, or chemical polishing. Then, predetermined portions of the n-type semiconductor layer 100, the active layer 200, and the p-type semiconductor layer 300 are removed using an etching process to define the light emitting device regions. The etching process is finished on the etch stop layers 500 disposed on the p-type semiconductor layer 300. Also, the n-type semiconductor layer 100, the active layer 200, and the p-type semiconductor layer 300 are etched inward with respect to portions of the etch stop layers 500 formed on the sidewalls thereof, thus the portions of the etch stop layers 500 formed on the sidewalls are removed during the etch process. Then, a passivation layer 800 is formed on sidewalls of the n-type semiconductor layer 100, the active layer 200, and the p-type semiconductor layer 300 and on predetermined upper portions of the n-type semi-conductor layer 100.

Referring to FIG. 48, an n-type electrode layer 900 is formed on predetermined upper portion of the n-type semiconductor layer 100, and a roughening process is then performed on portions of the n-type semiconductor layer 100 where the n-type electrode layer 900 is not formed. Thereafter, the cover layer 600, the first and second bonding layers 651 and 652, and the support substrate 750 are cut between the light emitting device regions using a dicing or laser-cutting process to complete the forming of a chip.

FIGS. 49 through 52 are cross-sectional views illustrating a method of manufacturing the light emitting device in accordance with the sixth embodiment of the present invention described in FIG. 6.

Referring to FIG. 49, an n-type semiconductor layer 100, an active layer 200, and a p-type semiconductor layer 300 are sequentially formed on a sapphire substrate 50. Then, predetermined portions of the p-type semiconductor layer 300, the active layer 200, and the n-type semiconductor layer 100 are etched to expose the sapphire substrate 50. The etching process is performed to have widths defining light emitting device regions. Next, p-type electrode layers 400 and etch stop layers 500 are formed on predetermined upper portions of the p-type semiconductor layer 300, wherein the etch stop layers 500 are spaced a predetermined distance from the p-type electrode layers 400.

Referring to FIG. 50, cover layers 600 are formed on upper portions including the p-type electrode layers 400 and the etch stop layers 500 of the separated light emitting device regions, and then a first bonding layer 651 is formed on the cover layers 600. After that, a second bonding layer 652 is formed on a support substrate 750, and then the first and second bonding layers 651 and 652 are bonded to each other to bond the cover layer 600 and the support substrate 750.

Referring to FIG. 51, the substrate 50 is removed from the n-type semiconductor layer 100 using a method such as laser irradiation, grinding, or chemical polishing. Then, a passivation layer 800 is formed on sidewalls of the n-type semiconductor layer 100, the active layer 200, and the p-type semiconductor layer 300 and on predetermined upper portions of the n-type semiconductor layer 100. The passivation layer 800 is also formed to fill a space between the etch stop layers 500 and the first bonding layer 651.

Referring to FIG. 52, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the first and second bonding layers 651 and 652 and the support substrate 750 are cut between the light emitting device regions using a dicing or laser-cutting process to complete the forming of a chip.

FIGS. 53 through 56 are cross-sectional views illustrating a method of manufacturing the light emitting device in accordance with the seventh embodiment of the present invention described in FIG. 7.

Referring to FIG. 53, an n-type semiconductor layer 100, an active layer 200, and a p-type semiconductor layer 300 are sequentially formed on a sapphire substrate 50. Then, a p-type electrode layer 400 is formed on the p-type semiconductor layer 300. The p-type electrode layer 400 is formed of a transparent conductive oxide using a vacuum deposition process, and then is heat-treated in a gas atmosphere containing approximately 10% or more oxygen to have ohmic characteristics. Reflective layers 450 are formed of a reflective metal such as Ag or Al on predetermined upper portions of the p-type electrode layer 400. Then, etch stop layers 500, spaced a predetermined distance from the reflective layers 450, are formed on the p-type electrode layer 400.

Referring to FIG. 54, a cover layer 600 is formed on an entire upper portion of a resultant structure including the reflective layers 450 and the etch stop layers 500. Then a first bonding layer 651 is formed on the cover layer 600. After that, a second bonding layer 652 is formed on a support substrate 750, and then the first and second bonding layers 651 and 652 are bonded to each other to bond the cover layer 600 and the support substrate 750.

Referring to FIG. 55, the substrate 50 is removed from the n-type semiconductor layer 100 using a method such as laser irradiation, grinding, or chemical polishing. Then, given portions of the n-type semiconductor layer 100, the active layer 200, and the p-type semiconductor layer 300 are removed using an etching process to define the light emitting device regions. The etching process is finished on the etch stop layers 500 disposed on the p-type semiconductor layer 300. Then, a passivation layer 800 is formed on sidewalls of the n-type semiconductor layer 100, the active layer 200, and the p-type semiconductor layer 300 and on predetermined upper portions of the n-type semiconductor layer 100.

Referring to FIG. 56, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600, the first and second bonding layers 651 and 652 and the support substrate 750 are cut between the light emitting device regions using a dicing or laser-cutting process to complete the forming of a chip.

FIGS. 57 through 60 are cross-sectional views illustrating one example of a method of manufacturing the light emitting device in accordance with the eighth embodiment of the present invention described in FIG. 8.

Referring to FIG. 57, an n-type semiconductor layer 100, an active layer 200, and a p-type semiconductor layer 300 are sequentially formed on a sapphire substrate 50. Then, predetermined portions of the p-type semiconductor layer 300, the active layer 200, and the n-type semiconductor layer 100 are etched to expose the sapphire substrate 50. Next, p-type electrode layers 400 and reflective layers 450 are formed on predetermined upper portions of the p-type semiconductor layer 300.

Referring to FIG. 58, etch stop layers 500 are formed on exposed portions of the sapphire substrate 50 and on sidewalls of the n-type semiconductor layer 100, the active layer 200, and the p-type semiconductor layer 300 and on predetermined upper portions of the p-type semiconductor layer 300. The etch stop layers 500 on the upper portions of the p-type semiconductor layer 300 are spaced a predetermined distance from the p-type electrode layers 400. Thereafter, a cover layer 600 is formed on an entire upper portion of a resultant structure including the p-type electrode layers 400 and the etch stop layers 500. Then, a first bonding layer 651 is formed on the cover layer 600 and a second bonding layer 652 is formed on a support substrate 750. After that, the first and second bonding layers 651 and 652 are bonded to each other to bond the cover layer 600 and the support substrate 750.

Referring to FIG. 59, the substrate 50 is removed from the n-type semiconductor layer 100 using a method such as laser irradiation, grinding, or chemical polishing. Then, predetermined portions of the n-type semiconductor layer 100, the active layer 200, and the p-type semiconductor layer 300 are removed using an etching process to define the light emitting device regions. The etching process is finished on the etch stop layers 500 disposed on the p-type semiconductor layer 300. Also, the n-type semiconductor layer 100, the active layer 200, and the p-type semiconductor layer 300 are etched inward with respect to portions of the etch stop layers 500 formed on the sidewalls thereof, thus the portions of the etch stop layers 500 formed on the sidewalls are removed. Then, a passivation layer 800 is formed on sidewalls of the n-type semiconductor layer 100, the active layer 200, and the p-type semiconductor layer 300 and on predetermined upper portions of the n-type semiconductor layer 100.

Referring to FIG. 60, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600, a bonding layer 650 including the first and second bonding layers 651 and 652, and the support substrate 750 are cut between the light emitting device regions using a dicing or laser-cutting process to complete the forming of a chip.

FIGS. 61 through 64 are cross-sectional views illustrating another example of a method of manufacturing the light emitting device in accordance with the eighth embodiment of the present invention described in FIG. 8.

Referring to FIG. 61, an n-type semiconductor layer 100, an active layer 200, and a p-type semiconductor layer 300 are sequentially formed on a sapphire substrate 50. Then, predetermined portions of the p-type semiconductor layer 300, the active layer 200, and the n-type semiconductor layer 100 are etched to expose the sapphire substrate 50. The etching process is performed to have widths defining light emitting device regions. Photosensitive layers 410 or a photosensitive organic material is formed to fill the etched portions on the sapphire substrate 50. Next, p-type electrode layers 400 and reflective layers 450 are formed on predetermined upper portions of the p-type semiconductor layer 300.

Referring to FIG. 62, etch stop layers 500 are formed on predetermined upper portions of the p-type semiconductor layer 300. That is, the etch stop layers 500 are spaced a predetermined distance from the p-type electrode layers 400 and disposed on the photosensitive layers 410. Thereafter, a cover layer 600 is formed on an entire upper portion of a resultant structure including the p-type electrode layers 400, the reflective layers 450 and the etch stop layers 500. Then, a first bonding layer 651 is formed on the cover layer 600 and a second bonding layer 652 is formed on a support substrate 750. The first and second bonding layers 651 and 652 are bonded to each other to bond the cover layer 600 and the support substrate 750.

Referring to FIG. 63, the substrate 50 is removed from the n-type semiconductor layer 100 using a method such as laser irradiation, grinding, or chemical polishing. After that, the photosensitive layers 410 are removed, and then a passivation layer 800 is formed on sidewalls of the n-type semiconductor layer 100, the active layer 200, and the p-type semiconductor layer 300, which are exposed by the removing of the photosensitive layers 410, and on predetermined upper portions of the n-type semiconductor layer 100.

Referring to FIG. 64, an n-type electrode layer 900 is formed on predetermined upper portions of the n-type semiconductor layer 100, and a roughening process is then performed on portions of the n-type semiconductor layer 100 where the n-type electrode layer 900 is not formed. Thereafter, the cover layer 600, a bonding layer 650 including the first and second bonding layers 651 and 652, and the support substrate 750 are cut between the light emitting device regions using a dicing or laser-cutting process to complete the forming of a chip.

FIG. 65 is an optical microscope image illustrating a light emitting state of the light emitting device of FIG. 1 when current is applied to the light emitting device, in which the light emitting device is manufactured through the processes of FIGS. 10 through 16. The image shows that the substrate is completely separated from the sapphire substrate and the light emitting devices formed on the substrate are in good condition.

FIGS. 66 and 67 are graphs illustrating comparison in electrical and optical characteristics of a related art horizontal-type light emitting device B with the vertical-type light emitting device A of FIG. 1.

FIG. 66 is the graph illustrating comparison in current-voltage characteristics of the horizontal-type light emitting device B with the vertical-type light emitting device A. When a current of approximately 100 mA was applied, the vertical-type light emitting device A had a forward voltage of approximately 2.8 V that was less than approximately 2.9V of the horizontal-type light emitting device B by approximately 0.1V, which shows that the vertical-type light emitting device A consumes less power than the horizontal-type light emitting device B.

FIG. 67 is the graph illustrating comparison in optical power characteristics of the horizontal-type light emitting device B with the vertical-type light emitting device A. When a current of approximately 100 mA was applied, the vertical-type light emitting device A was 2.5 times or more greater in the optical power characteristics than the horizontal-type light emitting device B, which shows that the vertical-type light emitting device A emits 2.5 times or more light than the horizontal-type light emitting device B for the same power consumption.

FIG. 68 is a graph illustrating comparison in optical power characteristics with respect to current of a related art horizontal-type light emitting device B with a vertical-type light emitting device A in accordance with an exemplary embodiment.

The vertical-type light emitting device A emits 2.5 times or more light and is adapted to apply greater current than the horizontal-type light emitting device B, as illustrated in FIG. 68. This is because a metal or conductive substrate of the vertical-type light emitting device A has a heat dissipation coefficient greater than that of a sapphire substrate used for the horizontal-type light emitting device B. Thus, the vertical-type light emitting device A is more suitable as a high-power device.

Although the light emitting device and the method of manufacturing the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:
1. A light emitting device, comprising:
a first-type semiconductor layer comprising a roughened surface;
a second-type semiconductor layer;
an active layer arranged between the first-type semiconductor layer and the second-type semiconductor layer;
a first electrode, a first portion of the second-type semiconductor layer being arranged on the first electrode;
an etch stop layer spaced apart from the first electrode, a second portion of the second-type semiconductor layer being arranged on the etch stop layer;
a cover layer covering sides of the first electrode; and
a support layer comprising a multi-layer structure, the cover layer being arranged on the support layer.
2. The light emitting device of claim 1, further comprising a passivation layer covering sides of the active layer, the first-type semiconductor layer, and the second-type semiconductor layer.
3. The light emitting device of claim 2, wherein the passivation layer is arranged on a portion of a top surface of the first-type semiconductor layer.
4. The light emitting device of claim 1, wherein the cover layer comprises Ti or Cr.
5. The light emitting device of claim 1, wherein the support layer comprises a conductive layer.
6. The light emitting device of claim 1, wherein the support layer comprises a first layer comprising at least one of Au, Ni, W, Mo, Cu, Al, Ta, Ag, Pt, Cr, and an alloy thereof.
7. The light emitting device of claim 6, wherein the support layer further comprises a second layer comprising at least one of Au, Ni, W, Mo, Cu, Al, Ta, Ag, Pt, Cr, and an alloy thereof.

8. The light emitting device of claim 1, further comprising a second electrode arranged on the first-type semiconductor layer.

9. The light emitting device of claim 8, wherein the second electrode comprises Cr and Au or Ti and Al.

10. The light emitting device of claim 8, further comprising an anti-reflective layer disposed between the second electrode and the first-type semiconductor layer.

11. The light emitting device of claim 10, wherein the anti-reflective layer comprises one of indium tin oxide (ITO), ZnO, $SiO_2$, $Si_3N_4$, indium zinc oxide (IZO), or a combination thereof.

12. The light emitting device of claim 8, wherein the roughened surface contacts a side surface of the second electrode.

13. The light emitting device of claim 12, wherein the uppermost points of the roughened surface are lower than or coplanar with the bottom surface of the second electrode.

14. The light emitting device of claim 1, further comprising a diffusion barrier layer arranged on the cover layer.

15. The light emitting device of claim 14, wherein the diffusion barrier layer comprises at least one of Pt, Pd, W, Ni, Ru, Mo, Ir, Rh, Ta, Hf, Zr, Nb, V, or an alloy thereof.

16. The light emitting device of claim 1, further comprising a bonding layer disposed between the cover layer and the support layer.

17. The light emitting device of claim 1, further comprising a reflective layer arranged on the first electrode.

* * * * *